United States Patent
Vitale et al.

(10) Patent No.: US 11,675,251 B2
(45) Date of Patent: Jun. 13, 2023

(54) DOOR ASSEMBLIES FOR IMAGE CAPTURE DEVICES

(71) Applicant: GoPro, Inc., San Mateo, CA (US)

(72) Inventors: Nicholas Vitale, Foster City, CA (US); Chao Chen, San Mateo, CA (US)

(73) Assignee: GoPro, Inc., San Mateo, CA (US)

(*) Notice: Subject to any disclaimer, the term of this patent is extended or adjusted under 35 U.S.C. 154(b) by 0 days.

(21) Appl. No.: 17/638,164

(22) PCT Filed: Sep. 11, 2020

(86) PCT No.: PCT/US2020/050483
§ 371 (c)(1),
(2) Date: Feb. 24, 2022

(87) PCT Pub. No.: WO2021/055251
PCT Pub. Date: Mar. 25, 2021

(65) Prior Publication Data
US 2022/0365405 A1 Nov. 17, 2022

Related U.S. Application Data

(60) Provisional application No. 62/901,998, filed on Sep. 18, 2019.

(51) Int. Cl.
*G03B 17/08* (2021.01)
*H01M 50/271* (2021.01)

(52) U.S. Cl.
CPC .......... *G03B 17/08* (2013.01); *H01M 50/271* (2021.01)

(58) Field of Classification Search
CPC ................. H01M 50/271; G03B 17/02; E05C 19/10–145
See application file for complete search history.

(56) References Cited

U.S. PATENT DOCUMENTS 1,612,277 A 12/1926 Leo
D96,348 S 7/1935 Teaque
(Continued)

FOREIGN PATENT DOCUMENTS

CA 168972 4/1916
CN 1531337 A 9/2004
(Continued)

OTHER PUBLICATIONS

"FlyHi Battery". Found online Nov. 2, 2021 at amazon.com. Reference dated Nov. 21, 2016. 3 pages. Retrieved from https://www.amazon.com/ dp/B01MTQ9D74?tag=toptenbest-20. (Year: 2016).
(Continued)

*Primary Examiner* — Leon W Rhodes, Jr.
(74) *Attorney, Agent, or Firm* — Young Basile Hanlon & MacFarlane, P.C.

(57) ABSTRACT

An image capture device is disclosed that includes a body defining a peripheral cavity and a door assembly that is movable between an open position and a closed position to close and seal the peripheral cavity. The door assembly includes a door body; a slider that is supported by the door body for axial movement between a first position and a second position; a biasing member that is configured for engagement (contact) with the slider; a door lock including a stop that is configured for engagement (contact) with the biasing member; and a sealing member that is fixedly connected to the door lock.

20 Claims, 16 Drawing Sheets

(56) References Cited

U.S. PATENT DOCUMENTS

| | | |
|---|---|---|
| D118,296 S | 12/1939 | Tuomey |
| 3,508,482 A | 4/1970 | Taylor |
| 3,721,746 A | 3/1973 | Knappenberger |
| D243,618 S | 3/1977 | Kaye |
| 4,091,402 A | 5/1978 | Siegel |
| 4,208,028 A | 6/1980 | Brown |
| D260,513 S | 9/1981 | Comstock |
| 4,469,423 A | 9/1984 | Bresson |
| 4,646,141 A | 2/1987 | Timmermans |
| 4,733,259 A | 3/1988 | Ng |
| D299,651 S | 1/1989 | Preussner |
| D321,705 S | 11/1991 | Ohmura |
| D328,888 S | 8/1992 | Zhu |
| D329,040 S | 9/1992 | Seki |
| D334,169 S | 3/1993 | Antonczak |
| 5,216,371 A | 6/1993 | Nagai |
| D338,220 S | 8/1993 | Kohno |
| D339,365 S | 9/1993 | Urcuilio |
| D348,043 S | 6/1994 | Hamilton |
| D354,739 S | 1/1995 | Durham |
| 5,400,234 A | 3/1995 | Yu |
| D372,896 S | 8/1996 | Nagele |
| D385,283 S | 10/1997 | Snyder |
| D386,147 S | 11/1997 | Siddoway |
| D392,659 S | 3/1998 | Takano |
| 5,727,940 A | 3/1998 | Wanzenbock |
| 5,808,663 A | 9/1998 | Okaya |
| D400,496 S | 11/1998 | Barber |
| D402,955 S | 12/1998 | Smith |
| D404,356 S | 1/1999 | Higgins |
| D407,098 S | 3/1999 | Goto |
| D408,796 S | 4/1999 | Georgopulos |
| D409,160 S | 5/1999 | Sonntag |
| D412,153 S | 7/1999 | Chen |
| D418,107 S | 12/1999 | Murray, III |
| D423,449 S | 4/2000 | Naskali |
| D432,493 S | 10/2000 | Killebrew |
| 6,153,834 A | 11/2000 | Cole |
| D439,218 S | 3/2001 | Yu |
| D441,386 S | 5/2001 | Yamazaki |
| D442,982 S | 5/2001 | Adachi |
| 6,233,400 B1 | 5/2001 | Muramatsu |
| D449,577 S | 10/2001 | Nishio |
| 6,315,180 B1 | 11/2001 | Watkins |
| D456,006 S | 4/2002 | Maher |
| 6,380,713 B2 | 4/2002 | Namura |
| D457,132 S | 5/2002 | Petherbridge |
| D460,411 S | 7/2002 | Wang |
| D463,469 S | 9/2002 | Kawase |
| D463,774 S | 10/2002 | Buck |
| D474,489 S | 5/2003 | Kawashima |
| D480,682 S | 10/2003 | Kawase |
| D480,741 S | 10/2003 | Berger |
| D481,995 S | 11/2003 | Yokota |
| D483,329 S | 12/2003 | Kuo |
| D484,164 S | 12/2003 | Ogura |
| D486,510 S | 2/2004 | Ogura |
| D487,765 S | 3/2004 | Dow |
| 6,718,129 B1 | 4/2004 | Cornell |
| D490,370 S | 5/2004 | Picardo |
| D491,137 S | 6/2004 | Suzuki |
| D492,248 S | 6/2004 | Gregory |
| D494,940 S | 8/2004 | Fiocchi |
| D496,674 S | 9/2004 | Hayashi |
| D504,904 S | 5/2005 | Nagai |
| D509,189 S | 9/2005 | Buck |
| D510,721 S | 10/2005 | Axelrod |
| D512,371 S | 12/2005 | Axelrod |
| D515,121 S | 2/2006 | Bleau |
| D515,613 S | 2/2006 | Holmes |
| D516,502 S | 3/2006 | Small |
| D516,503 S | 3/2006 | Takeshita |
| D521,445 S | 5/2006 | Liu |
| D521,446 S | 5/2006 | Liu |
| D523,808 S | 6/2006 | Thor |
| D524,241 S | 7/2006 | Takeshita |
| D524,836 S | 7/2006 | Morita |
| D526,612 S | 8/2006 | Sugeno |
| D527,403 S | 8/2006 | Byun |
| D531,199 S | 10/2006 | Matsuda |
| D532,029 S | 11/2006 | Kim |
| D532,030 S | 11/2006 | Yoshida |
| D532,433 S | 11/2006 | Sato |
| D533,574 S | 12/2006 | Hamamura |
| D534,564 S | 1/2007 | Tainaka |
| D535,249 S | 1/2007 | Ogasawara |
| D535,253 S | 1/2007 | Buck |
| D538,322 S | 3/2007 | Horikiri |
| D544,463 S | 6/2007 | Harris, Jr. |
| D546,277 S | 7/2007 | Andre |
| D551,969 S | 10/2007 | Aurilio |
| D555,587 S | 11/2007 | Yamamoto |
| D556,803 S | 12/2007 | Ishida |
| D561,092 S | 2/2008 | Kim |
| D566,151 S | 4/2008 | Won |
| D576,486 S | 9/2008 | Koza |
| D577,729 S | 9/2008 | Derry |
| D577,731 S | 9/2008 | Altonji |
| D584,683 S | 1/2009 | Preliasco |
| D590,334 S | 4/2009 | Tatehata |
| D594,047 S | 6/2009 | Lee |
| D594,497 S | 6/2009 | Hatori |
| D596,217 S | 7/2009 | Kim |
| 7,617,944 B2 * | 11/2009 | Noguchi ............... G03B 17/02 220/254.6 |
| 7,626,621 B2 | 12/2009 | Ito |
| 7,653,292 B2 | 1/2010 | Yamaguchi |
| D610,539 S | 2/2010 | Dahan |
| 7,683,968 B2 | 3/2010 | Hagihara |
| D616,480 S | 5/2010 | Ookawa |
| D616,742 S | 6/2010 | Lymn |
| D617,360 S | 6/2010 | Endo |
| 7,728,905 B2 | 6/2010 | Tanaka |
| D621,860 S | 8/2010 | Fukano |
| D622,591 S | 8/2010 | Biesecker, II |
| 7,768,727 B2 | 8/2010 | Iida |
| 7,801,439 B2 | 9/2010 | Nagata |
| D631,835 S | 2/2011 | Neidhart |
| D635,607 S | 4/2011 | Takagi |
| D637,552 S | 5/2011 | Inman |
| D640,196 S | 6/2011 | Shuang |
| D641,389 S | 7/2011 | Dastagir |
| D642,517 S | 8/2011 | Inman |
| D643,809 S | 8/2011 | Okuda |
| D644,988 S | 9/2011 | Finney |
| D645,814 S | 9/2011 | Otani |
| 8,014,656 B2 | 9/2011 | Woodman |
| D646,222 S | 10/2011 | Tatehata |
| D647,554 S | 10/2011 | Yim |
| D647,935 S | 11/2011 | Raken |
| D647,944 S | 11/2011 | Jannard |
| D648,270 S | 11/2011 | Jiang |
| D654,850 S | 2/2012 | Obata |
| D654,853 S | 2/2012 | Bacon |
| D657,808 S | 4/2012 | Woodman |
| D660,339 S | 5/2012 | Yoshida |
| D660,788 S | 5/2012 | Ziring |
| 8,199,251 B2 | 6/2012 | Woodman |
| D664,995 S | 8/2012 | Akana |
| D665,340 S | 8/2012 | Obata |
| 8,241,783 B2 * | 8/2012 | Tsuji ............... H01M 50/271 429/97 |
| 8,247,106 B2 | 8/2012 | Takeshita |
| D667,003 S | 9/2012 | Richter |
| D668,247 S | 10/2012 | Kim |
| D674,749 S | 1/2013 | Moore |
| D676,476 S | 2/2013 | Ishikura |
| D680,097 S | 4/2013 | Davies |
| D681,550 S | 5/2013 | Corbin |
| D682,777 S | 5/2013 | Gupta |
| D682,778 S | 5/2013 | Baumgartner |
| 8,467,675 B2 | 6/2013 | Chen |
| D687,426 S | 8/2013 | Requa |
| D690,280 S | 9/2013 | Schul |

(56) References Cited

U.S. PATENT DOCUMENTS

| | | |
|---|---|---|
| 8,542,308 B2 | 9/2013 | Ozawa |
| D692,042 S | 10/2013 | Dawes |
| 8,544,643 B2 | 10/2013 | Yim |
| D692,939 S | 11/2013 | Huang |
| D699,672 S | 2/2014 | Kosugi |
| D700,136 S | 2/2014 | Morris |
| D700,166 S | 2/2014 | Petersen |
| D702,276 S | 4/2014 | Woodman |
| D702,278 S | 4/2014 | Kim |
| 8,743,277 B2 | 6/2014 | Matsuzawa |
| D708,189 S | 7/2014 | An |
| D708,571 S | 7/2014 | Ji |
| D709,439 S | 7/2014 | Ferber |
| 8,792,003 B2 | 7/2014 | Nakamura |
| D710,921 S | 8/2014 | Gioscia |
| D710,922 S | 8/2014 | Gioscia |
| D712,347 S | 9/2014 | Awiszus |
| D712,391 S | 9/2014 | Kim |
| D713,868 S | 9/2014 | Yang |
| 8,828,601 B2 | 9/2014 | Hara |
| 8,837,928 B1 | 9/2014 | Clearman |
| D715,347 S | 10/2014 | Troxel |
| D715,789 S | 10/2014 | Yoon |
| 8,865,339 B2 | 10/2014 | Enari |
| D718,617 S | 12/2014 | Taylor |
| D721,395 S | 1/2015 | Woodman |
| D722,043 S | 2/2015 | Requa |
| D722,864 S | 2/2015 | Greenthal |
| D723,456 S | 3/2015 | Currah |
| D724,013 S | 3/2015 | Zsolcsak |
| D724,538 S | 3/2015 | Baumgartner |
| D724,637 S | 3/2015 | Samuels |
| D724,638 S | 3/2015 | Samuels |
| D725,169 S | 3/2015 | Gioscia |
| D725,590 S | 3/2015 | Clyne |
| D725,691 S | 3/2015 | De Rosa |
| 8,992,102 B1 | 3/2015 | Samuels |
| D726,648 S | 4/2015 | Zealer |
| D727,387 S | 4/2015 | Hasegawa |
| D727,991 S | 4/2015 | Hasegawa |
| 9,004,783 B1 | 4/2015 | Woodman |
| D729,059 S | 5/2015 | Taylor |
| D729,761 S | 5/2015 | Hu |
| D729,762 S | 5/2015 | Hu |
| D730,287 S | 5/2015 | Motoyama |
| D730,423 S | 5/2015 | Vandenbussche |
| 9,033,596 B2 | 5/2015 | Samuels |
| D732,593 S | 6/2015 | Woodman |
| D733,781 S | 7/2015 | Chen |
| D733,788 S | 7/2015 | Baker |
| D734,799 S | 7/2015 | Woodman |
| 9,077,013 B2 | 7/2015 | Huang |
| D737,879 S | 9/2015 | Woodman |
| D739,451 S | 9/2015 | Gioscia |
| D740,868 S | 10/2015 | Gioscia |
| D741,394 S | 10/2015 | Gioscia |
| D741,932 S | 10/2015 | Huang |
| D742,818 S | 11/2015 | Lin |
| D742,952 S | 11/2015 | Nakajima |
| D744,572 S | 12/2015 | Tabuchi |
| D745,589 S | 12/2015 | Lee |
| D745,920 S | 12/2015 | Lee |
| 9,204,021 B2 | 12/2015 | Woodman |
| D750,146 S | 2/2016 | Costa |
| 9,260,909 B2 * | 2/2016 | Kaga ..................... H04N 23/51 |
| D750,680 S | 3/2016 | Chen |
| D750,686 S | 3/2016 | Chen |
| D750,687 S | 3/2016 | Samuels |
| D750,690 S | 3/2016 | Lee |
| D751,131 S | 3/2016 | Woodman |
| D752,672 S | 3/2016 | Clearman |
| D753,749 S | 4/2016 | Zhu |
| D754,238 S | 4/2016 | Woodman |
| D754,769 S | 4/2016 | Patulski |
| D755,270 S | 5/2016 | Vehlewald |
| D755,271 S | 5/2016 | Patulski |
| D755,274 S | 5/2016 | Lee |
| D755,874 S | 5/2016 | Yang |
| D758,467 S | 6/2016 | Zhang |
| D759,145 S | 6/2016 | Lee |
| D759,585 S | 6/2016 | Herbst |
| D760,309 S | 6/2016 | Parfitt |
| D760,312 S | 6/2016 | Lee |
| 9,360,742 B1 | 6/2016 | Harrison |
| 9,395,031 B1 | 7/2016 | Clearman |
| D762,759 S | 8/2016 | Wu |
| D763,346 S | 8/2016 | Jenkins |
| D763,941 S | 8/2016 | Smith |
| D764,559 S | 8/2016 | Luo |
| D765,594 S | 9/2016 | Li |
| D766,175 S | 9/2016 | Tsiopanos |
| D766,351 S | 9/2016 | Li |
| D769,346 S | 10/2016 | Nguyen |
| D769,814 S | 10/2016 | Lin |
| D772,804 S | 11/2016 | Nakashima |
| D772,966 S | 11/2016 | Song |
| 9,507,245 B1 | 11/2016 | Druker |
| D773,546 S | 12/2016 | Nguyen |
| D773,547 S | 12/2016 | Lee |
| D775,254 S | 12/2016 | Parfitt |
| D776,183 S | 1/2017 | Miyazaki |
| D776,610 S | 1/2017 | Nommensen |
| D776,612 S | 1/2017 | Chen |
| D776,738 S | 1/2017 | Clearman |
| D776,741 S | 1/2017 | Parfitt |
| D777,125 S | 1/2017 | Eder |
| D777,236 S | 1/2017 | Mai |
| D777,240 S | 1/2017 | Costa |
| D777,821 S | 1/2017 | Gioscia |
| D778,335 S | 2/2017 | Gioscia |
| D778,336 S | 2/2017 | Gioscia |
| D779,576 S | 2/2017 | Ikegame |
| D780,111 S | 2/2017 | Clyne |
| D780,112 S | 2/2017 | Lin |
| D780,244 S | 2/2017 | Wang |
| 9,588,407 B1 | 3/2017 | Harrison |
| D785,692 S | 5/2017 | Wang |
| D785,695 S | 5/2017 | Woodman |
| D785,696 S | 5/2017 | Parfitt |
| D785,697 S | 5/2017 | Costa |
| D788,835 S | 6/2017 | Wu |
| D789,435 S | 6/2017 | Nguyen |
| D790,001 S | 6/2017 | Parfitt |
| D790,002 S | 6/2017 | Nguyen |
| D790,454 S | 6/2017 | Lee |
| D791,211 S | 7/2017 | Fujita |
| D791,695 S | 7/2017 | Bergman |
| D791,848 S | 7/2017 | Zhu |
| D792,919 S | 7/2017 | Ryu |
| D793,463 S | 8/2017 | Houin |
| D794,554 S | 8/2017 | Chang |
| D794,695 S | 8/2017 | Zhang |
| D794,696 S | 8/2017 | Nguyen |
| D797,040 S | 9/2017 | Lavin, Jr. |
| D798,929 S | 10/2017 | Zhou |
| D800,202 S | 10/2017 | Hu |
| D800,817 S | 10/2017 | Sutton |
| D800,819 S | 10/2017 | Parfitt |
| D803,705 S | 11/2017 | Read |
| D803,919 S | 11/2017 | Jeong |
| D803,920 S | 11/2017 | Shin |
| D803,925 S | 11/2017 | Hoshi |
| D804,560 S | 12/2017 | Costa |
| D805,117 S | 12/2017 | Nguyen |
| D805,569 S | 12/2017 | Daugela |
| D806,155 S | 12/2017 | Parfitt |
| D806,775 S | 1/2018 | Nguyen |
| D808,163 S | 1/2018 | Song |
| D808,898 S | 1/2018 | Walker |
| D814,543 S | 4/2018 | Oshima |
| D815,032 S | 4/2018 | Lin |
| D815,677 S | 4/2018 | Gao |
| D816,753 S | 5/2018 | Zhang |
| D818,025 S | 5/2018 | Wong |

(56) References Cited

U.S. PATENT DOCUMENTS

| | | |
|---|---|---|
| D818,028 S | 5/2018 | Ramones |
| D818,029 S | 5/2018 | Fujita |
| D819,718 S | 6/2018 | Wu |
| D820,335 S | 6/2018 | Favè |
| D820,339 S | 6/2018 | Yau |
| D820,898 S | 6/2018 | Fujita |
| D821,480 S | 6/2018 | Gioscia |
| D821,481 S | 6/2018 | Gioscia |
| D824,982 S | 8/2018 | Lee |
| D825,636 S | 8/2018 | Hueber |
| D829,260 S | 9/2018 | Fujita |
| D830,446 S | 10/2018 | Muhlenkamp, IV |
| D832,905 S | 11/2018 | Liu |
| D832,906 S | 11/2018 | Hasegawa |
| D833,505 S | 11/2018 | Hu |
| D835,172 S | 12/2018 | Fujita |
| D835,574 S | 12/2018 | Trongone |
| D835,910 S | 12/2018 | Eliyahu |
| D836,696 S | 12/2018 | Zhang |
| D837,861 S | 1/2019 | Luo |
| D837,865 S | 1/2019 | Parfitt |
| D838,762 S | 1/2019 | Piekarski |
| D839,335 S | 1/2019 | Zhang |
| D839,945 S | 2/2019 | Lenz |
| D840,463 S | 2/2019 | Nguyen |
| D842,142 S | 3/2019 | Recker |
| D848,509 S | 5/2019 | Lee |
| D849,076 S | 5/2019 | Bertram |
| D849,078 S | 5/2019 | Girotti |
| D849,084 S | 5/2019 | Hu |
| D849,100 S | 5/2019 | Hsu |
| D849,108 S | 5/2019 | Huang |
| D849,730 S | 5/2019 | Charette |
| D850,513 S | 6/2019 | Gan |
| D851,155 S | 6/2019 | Hu |
| D852,255 S | 6/2019 | Guo |
| D852,256 S | 6/2019 | Bai |
| D854,597 S | 7/2019 | Gao |
| D855,675 S | 8/2019 | Luo |
| D857,076 S | 8/2019 | Gan |
| D859,498 S | 9/2019 | Lin |
| D861,592 S | 10/2019 | Venugopal |
| D861,761 S | 10/2019 | Bergman |
| D861,765 S | 10/2019 | Muhlenkamp, IV |
| D861,766 S | 10/2019 | Lim |
| D863,404 S | 10/2019 | Karpenko |
| D864,275 S | 10/2019 | Huang |
| D865,843 S | 11/2019 | Hu |
| D865,844 S | 11/2019 | Jalala |
| D865,845 S | 11/2019 | Sakai |
| D867,420 S | 11/2019 | Zhang |
| D867,427 S | 11/2019 | Bai |
| D868,871 S | 12/2019 | Nguyen |
| D868,874 S | 12/2019 | Muhlenkamp, IV |
| D869,844 S | 12/2019 | Eliyahu |
| D870,176 S | 12/2019 | Hokari |
| D870,183 S | 12/2019 | Tsukamoto |
| D871,480 S | 12/2019 | Hu |
| 10,523,925 B2 | 12/2019 | Woodman |
| D872,162 S | 1/2020 | Gao |
| 10,536,615 B2 | 1/2020 | Campbell |
| D876,521 S | 2/2020 | Costa |
| 10,574,871 B2 | 2/2020 | Abbas |
| D880,561 S | 4/2020 | Muhlenkamp |
| D880,567 S | 4/2020 | Zhang |
| D880,569 S | 4/2020 | Zhang |
| D881,974 S | 4/2020 | Nguyen |
| D882,666 S | 4/2020 | Tsukamoto |
| D884,597 S | 5/2020 | Pilliod |
| D887,970 S | 6/2020 | Himeno |
| D890,709 S | 7/2020 | Lim |
| D890,835 S | 7/2020 | Nguyen |
| D892,194 S | 8/2020 | Nguyen |
| D892,905 S | 8/2020 | Nguyen |
| D894,256 S | 8/2020 | Vitale |
| D897,400 S | 9/2020 | Liu |
| D897,403 S | 9/2020 | Liu |
| D897,408 S | 9/2020 | Tsukamoto |
| 10,768,508 B1 | 9/2020 | Woodman |
| D900,911 S | 11/2020 | Muhlenkamp, IV |
| D903,740 S | 12/2020 | Au |
| D906,396 S | 12/2020 | Schaarschmidt |
| D907,101 S | 1/2021 | Coster |
| D907,680 S | 1/2021 | Nguyen |
| D907,682 S | 1/2021 | Sjögren |
| D911,412 S | 2/2021 | Alberstein |
| D911,418 S | 2/2021 | Yap |
| D912,120 S | 3/2021 | Druker |
| D920,419 S | 5/2021 | Muhlenkamp, IV |
| D921,086 S | 6/2021 | Li |
| D921,737 S | 6/2021 | Liang |
| D921,740 S | 6/2021 | Coster |
| D923,075 S | 6/2021 | Grant |
| D925,643 S | 7/2021 | Hsu |
| D926,243 S | 7/2021 | Tsukamoto |
| D928,863 S | 8/2021 | Alberstein |
| D935,507 S | 11/2021 | Li |
| D939,608 S | 12/2021 | Han |
| D939,610 S | 12/2021 | Han |
| D940,066 S | 1/2022 | Venugopal |
| D941,904 S | 1/2022 | Coster |
| D942,373 S | 2/2022 | Ruffing |
| 2001/0034163 A1 | 10/2001 | Chiang |
| 2002/0046218 A1 | 4/2002 | Gilbert |
| 2002/0090212 A1 | 7/2002 | Shimamura |
| 2002/0136557 A1 | 9/2002 | Shimamura |
| 2003/0156212 A1 | 8/2003 | Kingetsu |
| 2004/0223752 A1 | 11/2004 | Ghanouni |
| 2005/0019029 A1 | 1/2005 | Kawakami |
| 2005/0208345 A1 | 9/2005 | Yoon |
| 2005/0212959 A1 | 9/2005 | Manabe |
| 2006/0233545 A1 | 10/2006 | Senba |
| 2006/0257137 A1 | 11/2006 | Fromm |
| 2007/0019948 A1 | 1/2007 | Terada |
| 2007/0071423 A1 | 3/2007 | Fantone |
| 2007/0140686 A1 | 6/2007 | Misawa |
| 2008/0117328 A1 | 5/2008 | Daoud |
| 2008/0248703 A1 | 10/2008 | Russell |
| 2009/0032420 A1 | 2/2009 | Zenzai |
| 2010/0060747 A1 | 3/2010 | Woodman |
| 2010/0061711 A1 | 3/2010 | Woodman |
| 2011/0001834 A1 | 1/2011 | Herrell |
| 2011/0042530 A1 | 2/2011 | Phillips |
| 2011/0129210 A1 | 6/2011 | Mcgucken |
| 2011/0216195 A1 | 9/2011 | Tanaka |
| 2011/0223447 A1 | 9/2011 | Ignor |
| 2011/0317065 A1 | 12/2011 | Lin |
| 2012/0211254 A1* | 8/2012 | Miura ................ H01M 50/213 174/50 |
| 2013/0186310 A1 | 7/2013 | Lymberis |
| 2013/0200768 A1 | 8/2013 | Miura |
| 2013/0321696 A1 | 12/2013 | Bae |
| 2014/0060582 A1 | 3/2014 | Hartranft |
| 2014/0160349 A1 | 6/2014 | Huang |
| 2015/0022717 A1 | 1/2015 | Coons |
| 2015/0122849 A1 | 5/2015 | Jones |
| 2015/0189131 A1 | 7/2015 | Woodman |
| 2015/0316835 A1 | 11/2015 | Scott |
| 2015/0318579 A1 | 11/2015 | Kwon |
| 2016/0116828 A1 | 4/2016 | Clearman |
| 2016/0119516 A1 | 4/2016 | Clearman |
| 2016/0131963 A1 | 5/2016 | Clearman |
| 2016/0209731 A1 | 7/2016 | Song |
| 2016/0274338 A1 | 9/2016 | Davies |
| 2017/0059967 A1 | 3/2017 | Harrison |
| 2017/0111559 A1 | 4/2017 | Abbas |
| 2017/0150236 A1 | 5/2017 | Newman |
| 2017/0195550 A1 | 7/2017 | Kim |
| 2017/0289413 A1 | 10/2017 | Samuels |
| 2017/0324890 A1 | 11/2017 | Moskovchenko |
| 2018/0039162 A1 | 2/2018 | Ali |
| 2018/0081258 A1 | 3/2018 | Clyne |
| 2018/0084194 A1 | 3/2018 | Woodman |
| 2018/0084215 A1 | 3/2018 | Jing |

(56) References Cited

U.S. PATENT DOCUMENTS

| | | |
|---|---|---|
| 2018/0102123 A1 | 4/2018 | Tisch |
| 2018/0103189 A1 | 4/2018 | Nguyen |
| 2018/0103190 A1 | 4/2018 | Nguyen |
| 2018/0146122 A1 | 5/2018 | Campbell |
| 2018/0198989 A1 | 7/2018 | Macmillan |
| 2018/0262682 A1 | 9/2018 | Wang |
| 2019/0179214 A1 | 6/2019 | Hara |
| 2020/0159091 A1 | 5/2020 | Vitale |
| 2020/0184690 A1 | 6/2020 | Guérin |
| 2020/0204721 A1 | 6/2020 | Douady |
| 2020/0204772 A1 | 6/2020 | Gounelle |
| 2020/0218136 A1 | 7/2020 | Au |
| 2020/0221010 A1 | 7/2020 | Douady |
| 2020/0221219 A1 | 7/2020 | Hardin |
| 2020/0259978 A1 | 8/2020 | Abbas |
| 2022/0299846 A1 | 9/2022 | Crow |
| 2022/0317548 A1 | 10/2022 | Sun |

FOREIGN PATENT DOCUMENTS

| | | | |
|---|---|---|---|
| CN | 1892403 | A | 1/2007 |
| CN | 101078859 | A | 11/2007 |
| CN | 101331815 | A | 12/2008 |
| CN | 102005552 | A | 4/2011 |
| CN | 207083334 | U | 3/2018 |
| CN | 207531231 | U | 6/2018 |
| EP | 0031985220005 | | 2/2018 |
| JP | H05304625 | A | 11/1993 |
| JP | 2001217564 | A | 8/2001 |
| JP | 2003142841 | A | 5/2003 |
| JP | 2005174919 | A * | 6/2005 |
| JP | 2007057997 | A | 3/2007 |
| JP | 2012083494 | A | 4/2012 |
| JP | 2012215667 | A * | 11/2012 |
| JP | 1595273 | | 1/2018 |
| JP | 1595299 | | 1/2018 |
| JP | 2018107558 | A | 7/2018 |

OTHER PUBLICATIONS

"GoPro Rechargeable Battery". Found online Mar. 10, 2022 at amazon.co.uk Reference dated Oct. 7, 2016. 4 pages. Retrieved from https:// www.amazon.co.uk/GoPro-Rechargeable-Battery-Official-Accessory-Black/dp/B01MOPV67H/?th=1 .(Year: 2016).

"Newmowa Rechargeable Battery" Found online Mar. 14, 2022 at amazon.co.uk. Reference dated Mar. 26, 2017. 6 pages. Retrieved from https:// www.amazon.co.uk/Newmowa-Rechargeable-AHDBT-302-Replacement-3-Channel/dp/B06XW6R74Z. (Year: 2017).

"Tectra Battery". Found online Mar. 10, 2022 at joom.com. Reference dated Jun. 6, 2019. 3 pages. Retrieved from https://www.joom.com/en/ products/5c9356006ecda80101b7f260. (Year: 2019).

"TELESIN Batteries". Found online Mar. 10, 2022 at amazon.com Reference dated Mar. 29, 2019. 3 pages. Retrieved from https:// www.amazon.com/TELESIN-Replacement-Batteries-Function-Waterproof/dp/B07Q4C1MST.(Year: 2019).

Alex Nld AHDBT501 TinEye. Tineye.com [published Jan. 13, 2017][online][Accessed Feb. 28, 2017]<Url:https://tineye.com/search/a068519109ac11d29440a513c6a88863d1- dc6e51/?extension.sub.-ver=chrome-1.1.5>, 4 pages.

Amazon.com: Ailuki Rechargeable Battery 1490MAH 2 Pack and 3-Channel Charger for GoPro Hero. Published Jun. 22, 2017. Retrieved from the internet at <https://www.annazon.conn/Rechargeable-Battery-3-Channel-Compatible-Original/dp/B0734J76NN/>, Jan. 19, 2019. 1 page. (Year: 2017).

Amazon.com: GoPro Battery (Fusion) . . . Date First Available of Feb. 1, 2018. Retrieved from the internet at <https://www.amazon.com/GoPro-Camera-ASBBA-001-Fusion-Battery/dp/B078XY2L42/>, Sep. 14, 2020. 1 page. (Year: 2018).

Chinese Office Action, Chinese Application No. 201430488714.2, dated Mar. 12, 2015, 3 pages.

Design U.S. Appl. No. 29/631,230, filed Feb. 28, 2017, Huy Phuong Nguyen et al., 82 pages.

Design U.S. Appl. No. 29/663,435, filed Sep. 14, 2018, Au et al., 68 pages.

Design U.S. Appl. No. 29/694,559, filed Jun. 11, 2019, Coster et al., 27 pages.

Design U.S. Appl. No. 29/699,945, filed Jul. 30, 2019, Huy Phuong Nguyen et al., 11 pages.

International Search Report and Written Opinion for App. No. PCT/CN2020/099915, dated Mar. 25, 2021, 10 pages.

International Search Report and Written Opinion for App. No. PCT/US2020/050479 dated Dec. 3, 2020, 6 pages.

International Search Report and Written Opinion for App. No. PCT/US2020/050483 dated Nov. 12, 2020, 9 pages.

Kingma Ebay. Ebay.com. [published Nov. 10, 2016][online][Accessed Feb. 28, 2017]<URL:http://www.ebay.com/itm/KingMa-AHDBT-501-Li-ion-Battery-1220- mAh-Dual-Charger-For-Gopro-Hero-5-Camera-/272413104511>, 4 pages.

Office Action for Taiwanese Patent Application No. TW 103304745, dated Jan. 28, 2016, 3 Pages.

PCT International Search Report and Written Opinion for PCT/US2014/058465, dated Dec. 23, 2014, 17 pages.

PCT International Search Report and Written Opinion for PCT/US2014/070655, dated Apr. 29, 2015, 13 Pages.

Shopthewall Tin Eye. Tineye.com[published Feb. 9, 2017][online][Accessed Feb. 27, 2017]. <URL:https://tineye.com/search/2432380143a2cf364f8dd9e5150bce62a316525- f/?extension.sub.-ver=chrome-1.1.5>, 4 pages.

U.S. Office Action for U.S. Appl. No. 14/148,536, filed Jul. 9, 2014, 9 pages.

U.S. Office Action for U.S. Appl. No. 14/536,683, filed Dec. 18, 2014, 14 Pages.

U.S. Office Action for U.S. Appl. No. 14/536,683, filed Jun. 9, 2015, 16 pages.

U.S. Office Action for U.S. Appl. No. 14/536,683, filed Sep. 21, 2015. 15 Pages.

U.S. Office Action, U.S. Appl. No. 29/576,880, filed Mar. 9, 2017, 13 pages.

Youtube.com: Ailuki Battery Charger for GoPro Hero 5/6/7 at ~9 seconds; published by Jake Wipp on Mar. 15, 2019; retrieved from the internet at «https://www.youtube.com/watch?v=M13sf6NBkVE» on Apr. 24, 2019; 1 page.

* cited by examiner

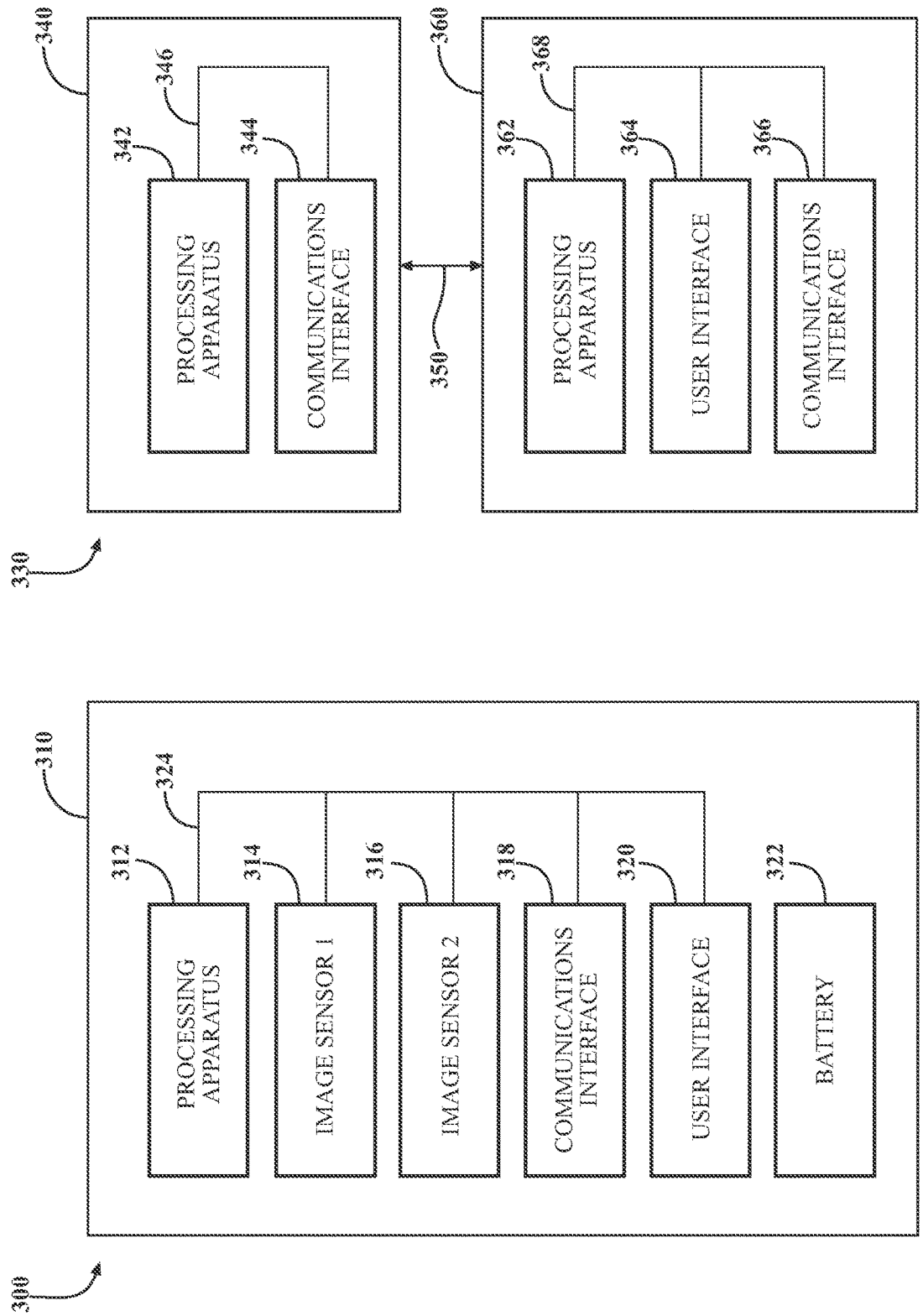

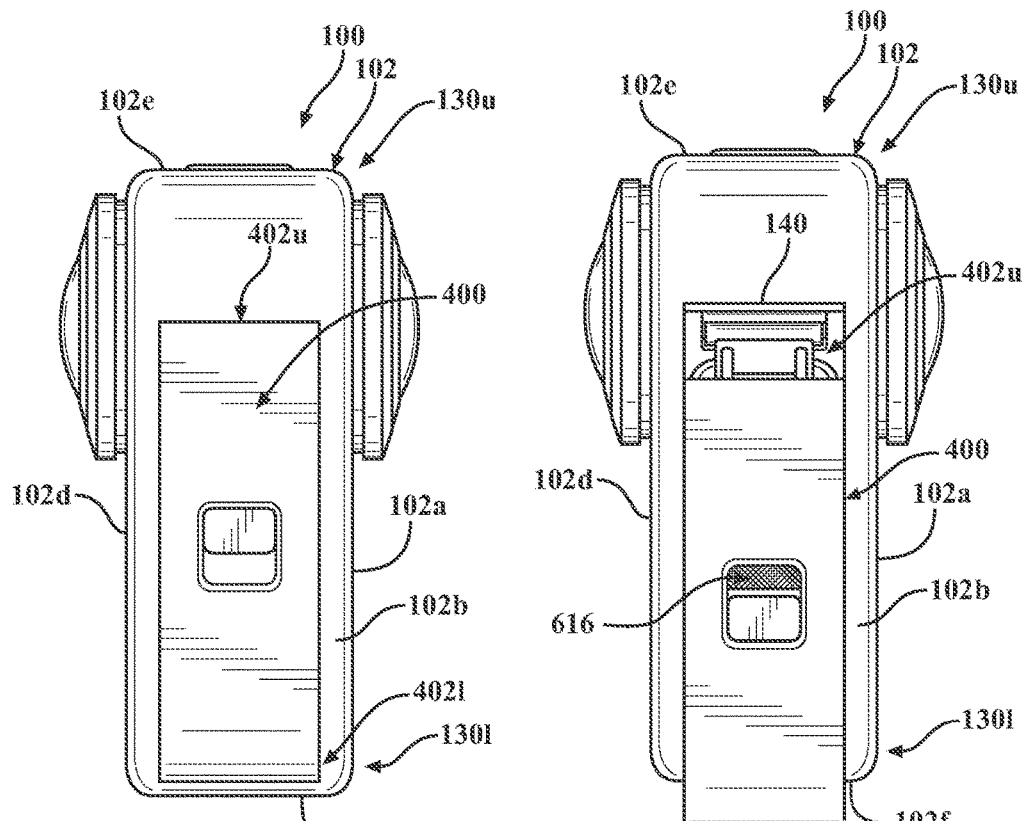
FIG. 4A
FIG. 4C
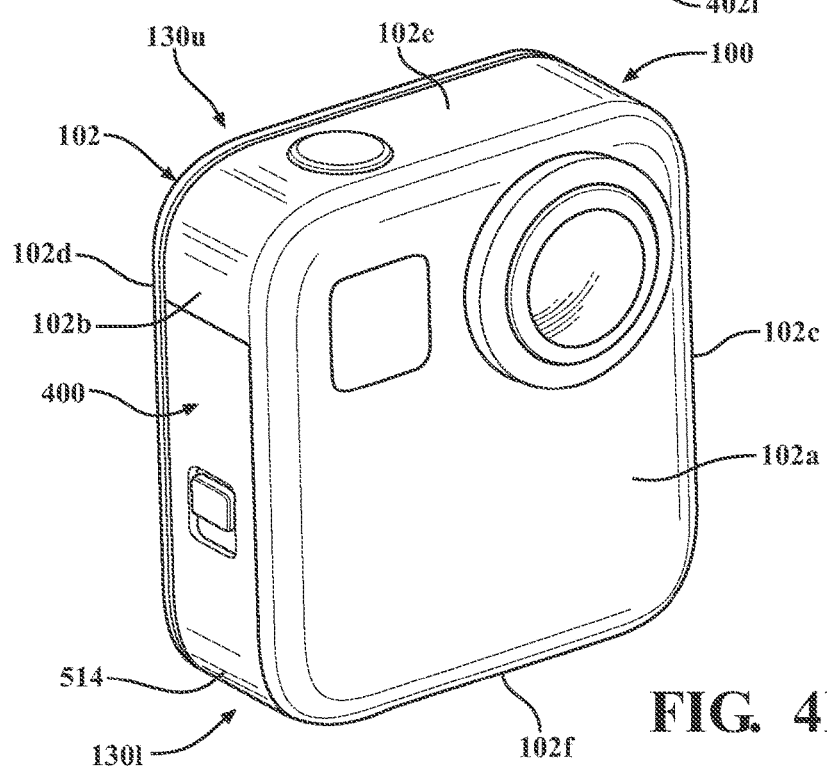
FIG. 4B

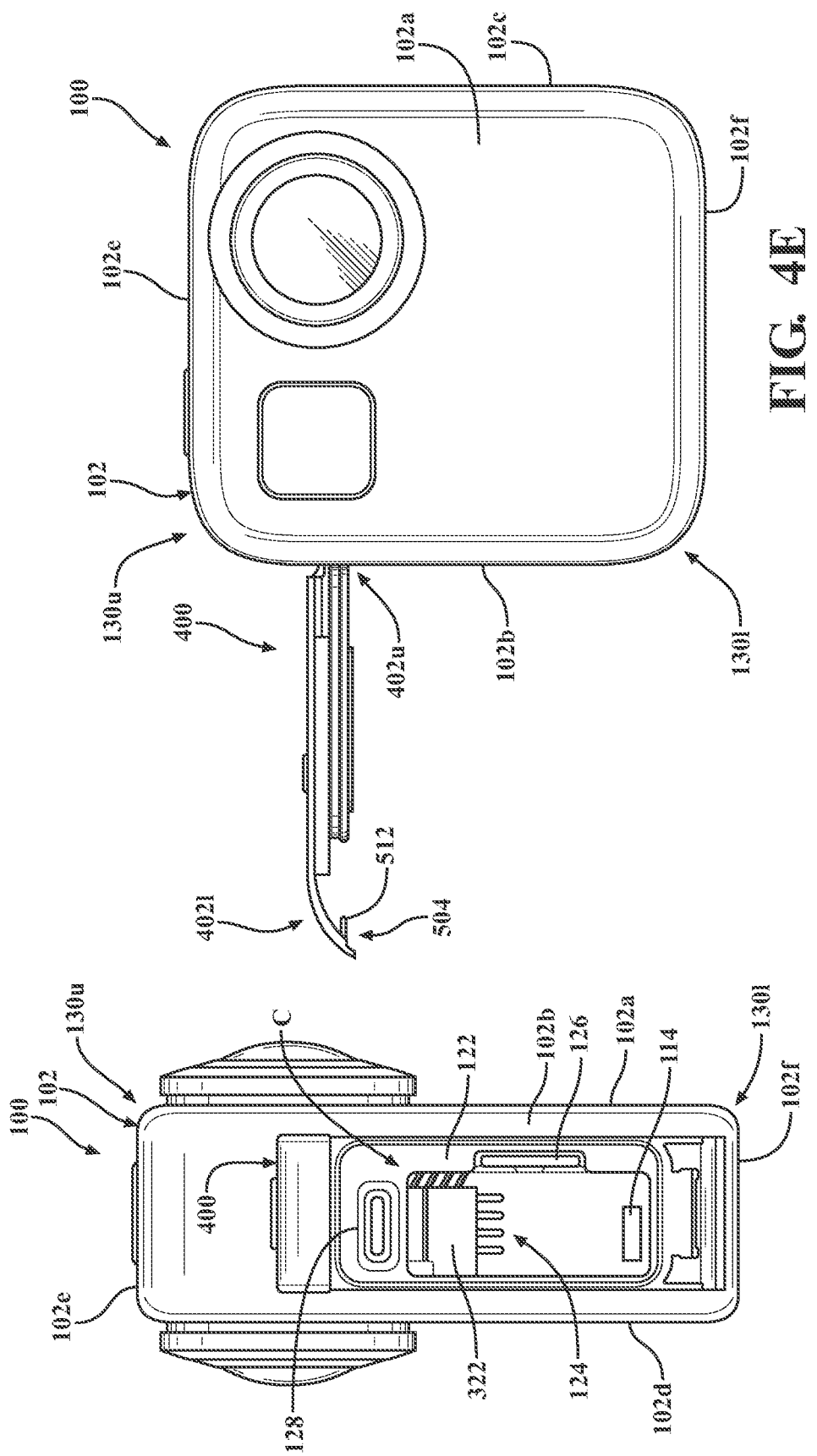

DOOR ASSEMBLIES FOR IMAGE CAPTURE DEVICES

CROSS-REFERENCE TO RELATED APPLICATIONS

This application is a 371 of International Application No. PCT/US2020/050483, filed on Sep. 11, 2020, which claims priority to U.S. Provisional Application No. 62/901,998, filed on Sep. 18, 2019, the entire disclosures of which are hereby incorporated by reference.

TECHNICAL FIELD

The present disclosure relates generally to image capture devices, and, more specifically, to an image capture device including a removable door assembly that is repositionable between closed and open positions to conceal, protect, and expose interior components of the image capture device.

BACKGROUND

Image capture devices typically include a plurality of doors that are used to conceal various internal components, such as, for example, a power source for the image capture device (e.g., one or more batteries); one or more accessory ports; an I/O interface; USB-C connectors; etc. The inclusion of multiple doors, however, requires multiple seals (one for each door), and presents an elevated risk that water and/or debris may enter the image capture device. Additionally, in known image capture devices, the doors are often fixedly connected to (i.e., non-removable from) a body of the image capture device.

To address these concerns, the present disclosure describes image capture devices that include a single, removable door including an integrated sealing member.

SUMMARY

In one aspect of the present disclosure, an image capture device is disclosed that includes a body defining a peripheral cavity and a door assembly that is movable between an open position and a closed position to close and seal the peripheral cavity. The door assembly includes a door body defining a window; a slider extending into the window that is supported by the door body for axial movement between a first position and a second position; a biasing member that is configured for engagement (contact) with the slider; a door lock including a stop that is configured for engagement (contact) with the biasing member; and a sealing member that is fixedly connected to the door lock.

When the slider is in the first position, the door body is axially fixed in relation to the body of the image capture device to inhibit movement of the door assembly from the closed position to the open position, and when the slider is in the second position, the door body is axially movable in relation to the body of the image capture device to allow for movement of the door assembly from the closed position to the open position.

The biasing member is configured for engagement (contact) with the slider such that axial movement of the slider causes deflection of the biasing member from a normal configuration to a deflected configuration. Additionally, the biasing member is axially fixed to the door body such that axial movement of the door body causes corresponding axial movement of the biasing member.

The door lock includes a stop that is configured for engagement (contact) with the biasing member in the normal configuration to inhibit axial movement of the biasing member and the door body. Deflection of the biasing member during movement from the normal configuration to the deflected configuration, however, moves the biasing member out of engagement (contact) with the stop to allow for axial movement of the biasing member and the door body.

The sealing member is fixedly connected to the door lock such that the door lock, the biasing member, and the slider are positioned between the door body and the sealing member. The sealing member includes a resilient material and is positioned such that the sealing member is compressed within the peripheral cavity during movement of the door assembly from the open position to the closed position to form a seal between the door assembly and the body of the image capture device when the door assembly is in the closed position.

In certain embodiments, the door body may be axially movable between a locked position and an unlocked position. In certain embodiments, the door assembly may be rotationally fixed in relation to the body of the image capture device when the door body is in the locked position and the door assembly may be rotatable in relation to the body of the image capture device when the door body is in the unlocked position to allow for movement of the door assembly from the closed position to the open position. In certain embodiments, the door body may include a locking member that is configured for engagement (contact) with a receptacle defined by the body of the image capture device when the door body is in the locked position. In certain embodiments, the locking member may be separated from the receptacle when the door body is in the unlocked position. In certain embodiments, the biasing member may include a retention structure that is configured for contact with the stop on the door lock. In certain embodiments, the retention structure and the stop on the door lock may be axially aligned when the biasing member is in the normal configuration to inhibit axial movement of the biasing member and the door body. In such embodiments, movement of the biasing member into the deflected configuration may cause axial misalignment between the retention structure and the stop to allow for axial movement of the biasing member and the door body. In certain embodiments, the retention structure may include a pair of wings that extend laterally outward from a body portion of the biasing member. In certain embodiments, the pair of wings may be configured for positioning within corresponding channels defined by the door lock to inhibit movement of the biasing member and the door body away from the sealing member along an axis generally orthogonal in relation to a longitudinal axis of the door assembly. In certain embodiments, the slider may include a deflector that is configured for engagement (contact) with the biasing member to facilitate deflection of the biasing member towards the door lock as the slider moves from the first position to the second position. In certain embodiments, the biasing member may define an opening that is configured to receive the slider. In certain embodiments, the slider may include an angled surface that is configured for engagement (contact) with an end wall defining the opening in the biasing member to facilitate deflection of the biasing member as the slider moves from the first position to the second position. In certain embodiments, the sealing member may define a channel that is configured to receive a finger extending from the biasing member. In certain embodiments, the channel may define an end wall that is configured for engagement (contact) with the finger to inhibit continued axial movement of the biasing member and the door body. In certain embodiments, the sealing member may be indirectly connected to the door body via the door lock and the biasing member. In certain embodiments, the sealing member may include an engagement structure that is configured to rotatably connect and axially fix the sealing member to the body of the image capture device such that the door assembly is rotatable in relation to the body of the image capture device during movement between the open position and the closed position. In certain embodiments, the image capture device may further include one or more of a power source; an accessory port; an I/O interface; and a USB-C connector. In such embodiments, the power source, the accessory port, the I/O interface, and/or the USB-C connector may be positioned for access via the peripheral cavity when the door assembly is in the open position. It is envisioned that the image capture device described above may include any combination of features and elements described in this paragraph.

In another aspect of the present disclosure, a door assembly for an image capture device is disclosed. The door assembly includes a sealing member that is releasably connectable to the image capture device and configured to form a seal with the image capture device upon closure of the door assembly; a door lock that is fixed to the sealing member; a biasing member that is received by the door lock; a door body that is axially movable in relation to the image capture device along a first axis of movement between a locked position and an unlocked position; and a slider that is supported by the door body.

When the door body is in the locked position, the door assembly is rotationally fixed in relation to the image capture device, and when the door body is in the unlocked position, the door assembly is rotatable in relation to the image capture device to allow for opening of the door assembly. The door body is fixedly connected to the biasing member such that axial movement of the door body causes corresponding axial movement of the biasing member.

The slider is supported by the door body to facilitate axial movement of the slider along a second axis of movement that extends in generally parallel relation the first axis of movement. The slider is configured for engagement (contact) with the biasing member such that movement of the slider between first and second positions causes deflection of the biasing member between a normal configuration and a deflected configuration. The biasing member and the door body are axially fixed in relation to the image capture device when the biasing member is in the normal configuration and are axially movable in relation to the image capture device when the biasing member is in the deflected configuration such that movement of the slider into the second position facilitates opening of the door assembly.

In certain embodiments, the door lock may include a pair of stops and the biasing member may include a pair of wings that are axially aligned with the pair of stops when the biasing member is in the normal configuration such that engagement (contact) between the pair of stops and the pair of wings inhibits axial movement of the biasing member and the door body. In such embodiments, movement of the biasing member into the deflected configuration may move the pair of wings out of axial alignment with the pair of stops to allow for axial movement of the biasing member and the door body. In certain embodiments, the pair of wings may be configured for positioning within corresponding channels defined by the door lock to inhibit movement of the biasing member and the door body away from the sealing member along an axis that is generally orthogonal in relation to a longitudinal axis of the door assembly. In certain embodiments, the slider may include a deflector that is configured for engagement (contact) with the biasing member to facilitate deflection of the biasing member during axial movement of the slider from the first position to the second position and movement of the pair of wings out of axial alignment with the pair of stops. In certain embodiments, the biasing member may define an opening that is configured to receive the slider. In certain embodiments, the slider may include an angled surface that is configured for engagement (contact) with an end wall defining the opening in the biasing member to facilitate deflection of the biasing member as the slider moves from the first position to the second position. In certain embodiments, the sealing member may define a channel that is configured to receive a finger extending from the biasing member. In certain embodiments, the channel may define an end wall that is configured for engagement (contact) with the finger to inhibit continued axial movement of the biasing member and the door body. It is envisioned that the door assembly described above may include any combination of features and elements described in this paragraph.

In another aspect of the present disclosure, a method of assembling an image capture device including a door assembly is disclosed. The method includes removably connecting the door assembly to the image capture device by inserting a pivot member on the image capture device into a clip on a sealing member of the door assembly to allow for rotation of the door assembly in relation to a body of the image capture device during opening and closure; fixedly securing a door lock to the sealing member; positioning a biasing member within the door lock; connecting a slider to a door body; and fixedly connecting the biasing member to the door body.

The slider is axially movable in relation to the door body and is configured for engagement (contact) with the biasing member such that axial movement of the slider causes corresponding axial movement of the biasing member via the door body.

The biasing member is connected to the door body such that axial movement of the door body during locking and unlocking of the door assembly causes corresponding axial movement of the biasing member.

In certain embodiments, connecting the slider and the biasing member to the door body may include positioning the slider and the biasing member such that, during locking and unlocking of the door assembly, the slider is movable along a first axis of movement and the biasing member and the door body are movable along a second axis of movement extending in generally parallel relation to the first axis of movement. In certain embodiments, connecting the biasing member to the door body may include connecting the biasing member to the door body such that axial movement of the slider causes deflection of the biasing member along an axis of movement extending in generally orthogonal relation to each of the first axis of movement and the second axis of movement. It is envisioned that the method described above may include any combination of features, elements, and/or tasks described in this paragraph.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

FIGS. 3A-B are block diagrams of examples of image capture systems.

FIG. 4A is a side, plan view of the image capture device including a door assembly according to the principles of the present disclosure shown in a closed, locked position.

FIG. 4B is a front, perspective view of the image capture device with the door assembly shown in the closed, locked position.

FIG. 4C is a side, plan view of the image capture device with the door assembly shown in a closed, unlocked position.

FIG. 4D is a side, plan view of the image capture device with the door assembly shown in an open position.

FIG. 4E is a front, plan view of the image capture device with the door assembly shown in the open position.

DETAILED DESCRIPTION

Figure 1A:
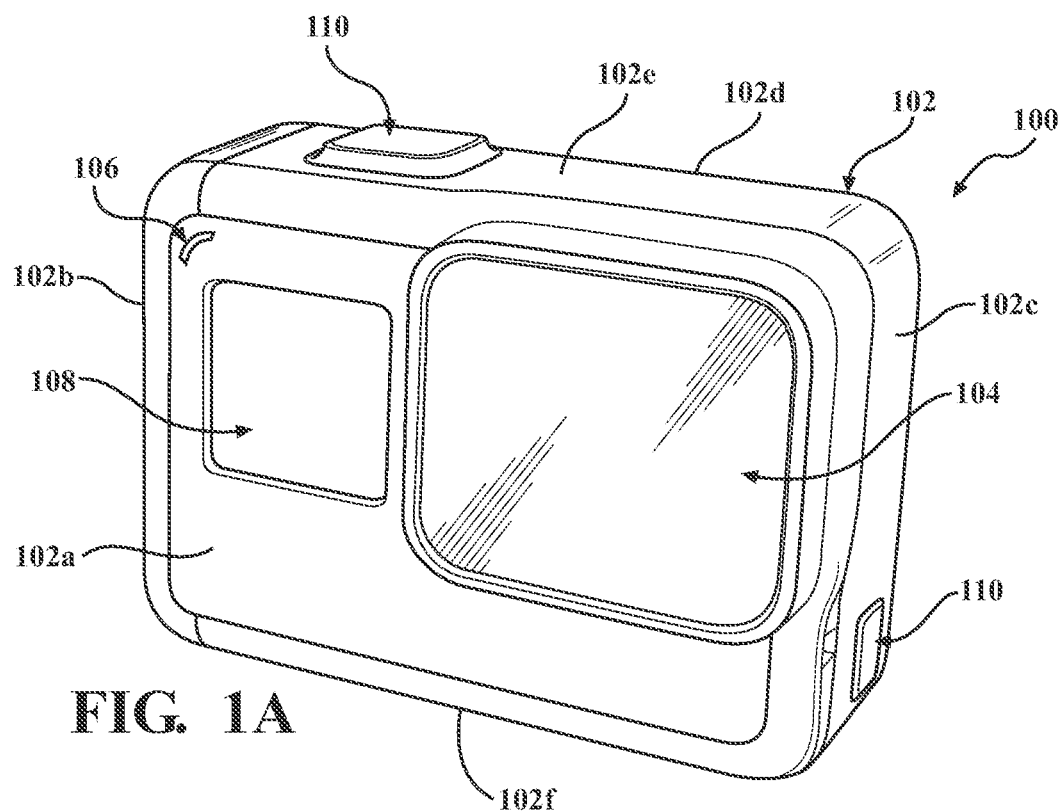
FIGS. 1A-D are isometric views of an example of an image capture device.

The present disclosure describes image capture devices and various embodiments of door assemblies for use therewith. The door assemblies described herein are configured for removable connection to an image capture device and are movable between open and closed positions to conceal and permit access to various internal components of the image capture device, including, for example, a power source (e.g., one or more batteries); one or more accessory ports; an I/O interface; USB-C connectors; etc. To guard against (if not entirely prevent) the entry of debris and/or water, the door assemblies described herein include a sealing member that is configured to form a (waterproof) seal with a body of the image capture device upon closure.

In addition to the sealing member, the door assemblies described herein include a door body that is movable (e.g., slidable) between locked and unlocked positions; a biasing member (e.g., a spring clip) that is fixedly connected to the door body; a door lock that inhibits axial movement of the door body, and, thus, the biasing member; a slider that is supported by the door body for axial movement between first and second positions; and a spacer.

In the locked position, the door body engages (contacts) the body of the image capture device to inhibit opening of the door assembly, and in the unlocked position, the door body is disengaged from (out of contact with) the body of the image capture device to permit opening of the door assembly. Axial movement of the door body, however, is restrained via engagement (contact) between the biasing member and a stop on the door lock until movement of the slider into the second position occurs, thereby inhibiting (if not entirely preventing) inadvertent (e.g., accidental or unwanted) movement of the door body into the unlocked position (e.g., in the event that the image capture device is dropped), and, thus, inadvertent (e.g., accidental or unwanted) opening of the door assembly.

As the slider moves from the first position into the second position, the slider causes deflection of the biasing member from a normal configuration to a deflected configuration. In the deflected configuration, the biasing member is moved out of engagement (contact) with the stop on the door lock, which allows for axial movement of the biasing member, and, thus, the door body to unlock the door assembly.

The spacer is supported by (e.g., is secured to) the sealing member to reduce (if not entirely eliminate) undesirable relative movement between the components of the door assembly. Additionally, or alternatively, the spacer may enhance the seal formed between the sealing member and the image capture device upon closure of the door assembly; increase shock absorption; and/or enhance electrical connectivity between the components of the image capture device.

FIGS. 1A-D are isometric views of an example of an image capture device 100. The image capture device 100 may include a body 102 having a lens 104 structured on a front surface of the body 102, various indicators on the front surface of the body 102 (such as LEDs, displays, and the like), various input mechanisms (such as buttons, switches, and touchscreen mechanisms), and electronics (e.g., imaging electronics, power electronics, etc.) internal to the body 102 for capturing images via the lens 104 and/or performing other functions. The image capture device 100 may be configured to capture images and video and to store captured images and video for subsequent display or playback.

The image capture device 100 may include various indicators, including LED lights 106 and an LCD display 108. The image capture device 100 may also include buttons 110 configured to allow a user of the image capture device 100 to interact with the image capture device 100, to turn the image capture device 100 on, to operate latches or hinges associated with doors of the image capture device 100, and/or to otherwise configure the operating mode of the image capture device 100. The image capture device 100 may also include a microphone 112 configured to receive and record audio signals in conjunction with recording video.

Figure 1B:
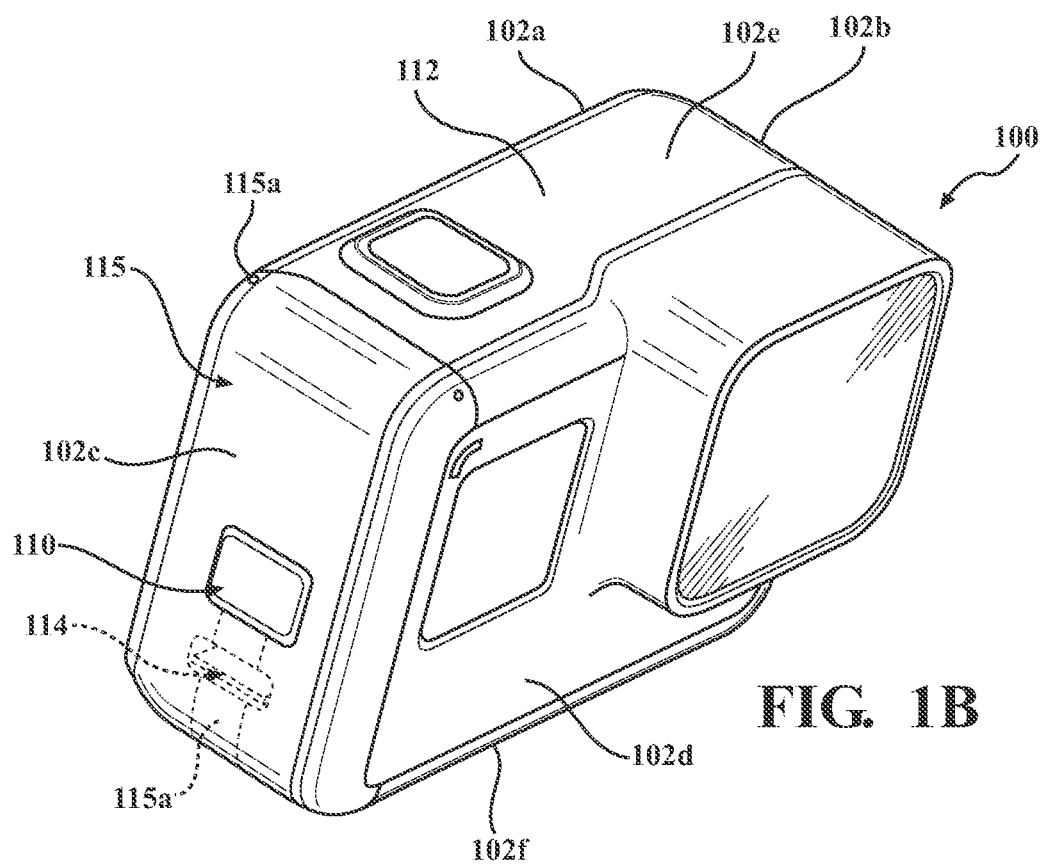
Figure 1C:
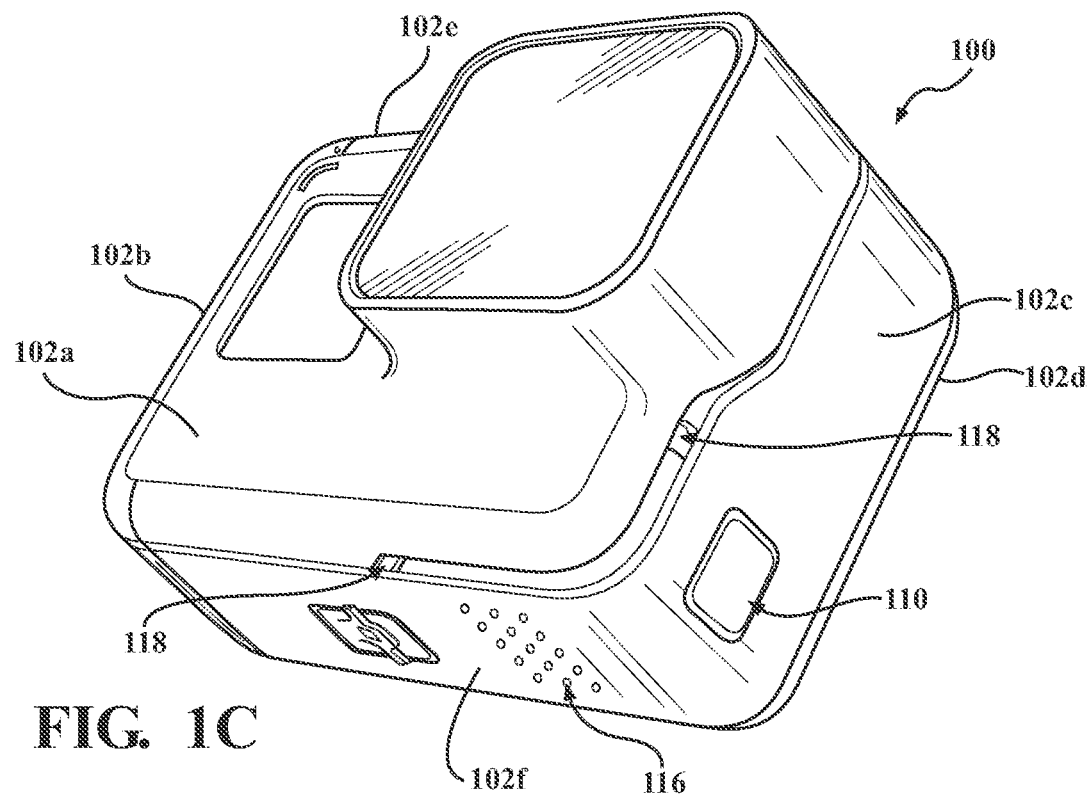
Figure 1D:
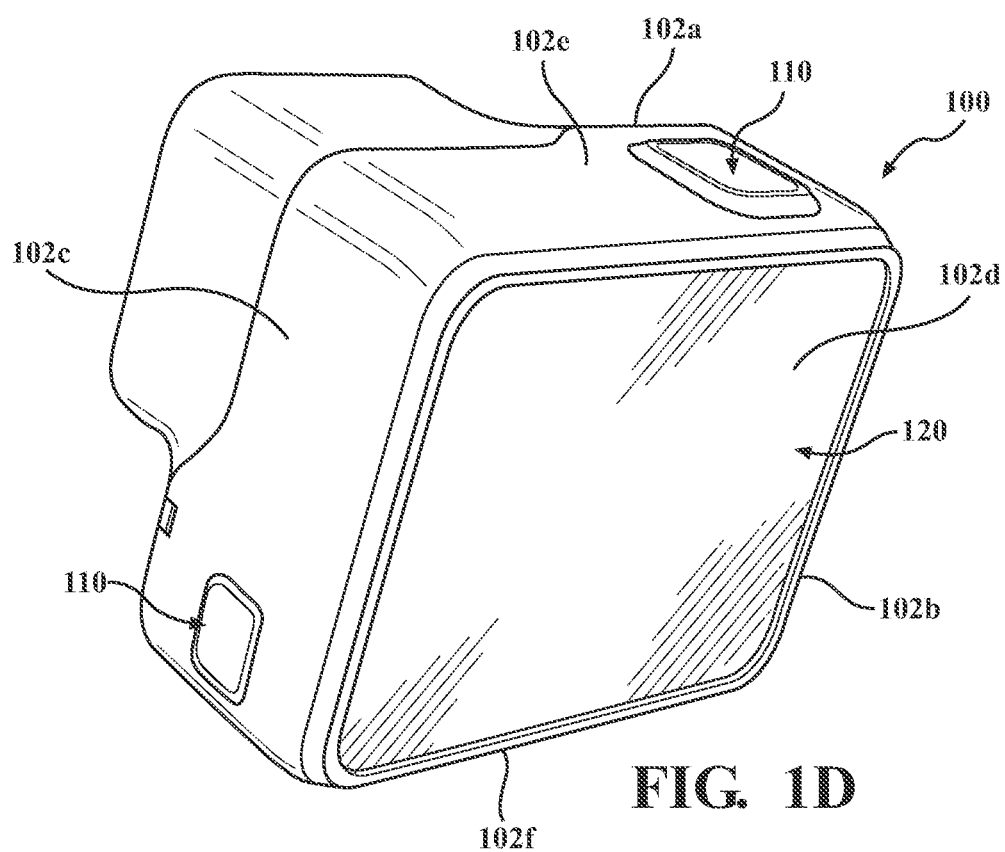

The image capture device 100 may include an I/O interface 114 (e.g., hidden as indicated using dotted lines). As best shown in FIG. 1B, the I/O interface 114 can be covered and sealed by a removable door 115 of the image capture device 100. The removable door 115 can be secured, for example, using a latch mechanism 115a (e.g., hidden as indicated using dotted lines) that is opened by engaging the associated button 110 as shown.

The removable door 115 can also be secured to the image capture device 100 using a hinge mechanism 115b, allowing the removable door 115 to rotate (e.g., pivot) between an open position allowing access to the I/O interface 114 and a closed position blocking access to the I/O interface 114. The removable door 115 can also have a removed position (not shown) where the entire removable door 115 is separated from the image capture device 100, that is, where both the latch mechanism 115a and the hinge mechanism 115b allow the removable door 115 to be removed from the image capture device 100.

The image capture device 100 may also include another microphone 116 integrated into the body 102. The front surface of the image capture device 100 may include two drainage ports as part of a drainage channel 118. The image capture device 100 may include an interactive display 120 that allows for interaction with the image capture device 100 while simultaneously displaying information on a surface of the image capture device 100. As illustrated, the image capture device 100 may include the lens 104 that is configured to receive light incident upon the lens 104 and to direct received light onto an image sensor internal to the lens 104.

The image capture device 100 of FIGS. 1A-D includes an exterior that encompasses and protects internal electronics. In the present example, the exterior includes six surfaces (i.e., a front face 102a, side (left and right) faces 102b, 102c, a back face 102d, a top face 102e, and a bottom face 102f) that form a rectangular cuboid. Furthermore, both the front and rear surfaces of the image capture device 100 are rectangular. In other embodiments, the exterior may have a different shape. The image capture device 100 may be made of a rigid material such as plastic, aluminum, steel, or fiberglass. The image capture device 100 may include features other than those described herein. For example, the image capture device 100 may include additional buttons or different interface features, such as interchangeable lenses, cold shoes and hot shoes that can add functional features to the image capture device 100, etc.

The image capture device 100 may include various types of image sensors, such as charge-coupled device (CCD) sensors, active pixel sensors (APS), complementary metal-oxide-semiconductor (CMOS) sensors, N-type metal-oxide-semiconductor (NMOS) sensors, and/or any other image sensor or combination of image sensors.

Although not illustrated, in various embodiments, the image capture device 100 may include other additional electrical components (e.g., an image processor, camera SoC (system-on-chip), etc.), which may be included on one or more circuit boards within the body 102 of the image capture device 100.

The image capture device 100 may interface with or communicate with an external device, such as an external user interface device, via a wired or wireless computing communication link (e.g., the I/O interface 114). The user interface device may, for example, be the personal computing device 360 described below with respect to FIG. 3B. Any number of computing communication links may be used. The computing communication link may be a direct computing communication link or an indirect computing communication link, such as a link including another device, or a network, such as the Internet, may be used.

In some implementations, the computing communication link may be a Wi-Fi link, an infrared link, a Bluetooth (BT) link, a cellular link, a ZigBee link, a near-field communications (NFC) link (such as an ISO/IEC 20643 protocol link), an Advanced Network Technology interoperability (ANT+) link, and/or any other wireless communications link or combination of links.

In some implementations, the computing communication link may be an HDMI link, a USB link, a digital video interface link, a display port interface link (such as a Video Electronics Standards Association (VESA) digital display interface link), an Ethernet link, a Thunderbolt link, and/or other wired computing communication link.

The image capture device 100 may transmit images, such as panoramic images, or portions thereof, to the user interface device (not shown) via the computing communication link, and the user interface device may store, process, display, or a combination thereof the panoramic images.

The user interface device may be a computing device, such as a smartphone, a tablet computer, a phablet, a smart watch, a portable computer, and/or another device or combination of devices configured to receive user input, communicate information with the image capture device 100 via the computing communication link, or receive user input and communicate information with the image capture device 100 via the computing communication link.

The user interface device may display, or otherwise present, content, such as images or video, acquired by the image capture device 100. For example, a display of the user interface device may be a viewport into the three-dimensional space represented by the panoramic images or video captured or created by the image capture device 100.

The user interface device may communicate information, such as metadata, to the image capture device 100. For example, the user interface device may send orientation information of the user interface device with respect to a defined coordinate system to the image capture device 100, such that the image capture device 100 may determine an orientation of the user interface device relative to the image capture device 100.

Based on the determined orientation, the image capture device 100 may identify a portion of the panoramic images or video captured by the image capture device 100 for the image capture device 100 to send to the user interface device for presentation as the viewport. In some implementations, based on the determined orientation, the image capture device 100 may determine the location of the user interface device and/or the dimensions for viewing of a portion of the panoramic images or video.

The user interface device may implement or execute one or more applications to manage or control the image capture device 100. For example, the user interface device may include an application for controlling camera configuration, video acquisition, video display, or any other configurable or controllable aspect of the image capture device 100.

The user interface device, such as via an application, may generate and share, such as via a cloud-based or social media service, one or more images, or short video clips, such as in response to user input. In some implementations, the user interface device, such as via an application, may remotely control the image capture device 100, such as in response to user input.

The user interface device, such as via an application, may display unprocessed or minimally processed images or video captured by the image capture device 100 contemporaneously with capturing the images or video by the image capture device 100, such as for shot framing, which may be referred to herein as a live preview, and which may be performed in response to user input. In some implementations, the user interface device, such as via an application, may mark one or more key moments contemporaneously with capturing the images or video by the image capture device 100, such as with a tag, such as in response to user input.

The user interface device, such as via an application, may display, or otherwise present, marks or tags associated with images or video, such as in response to user input. For example, marks may be presented in a camera roll application for location review and/or playback of video highlights.

The user interface device, such as via an application, may wirelessly control camera software, hardware, or both. For example, the user interface device may include a web-based graphical interface accessible by a user for selecting a live or previously recorded video stream from the image capture device 100 for display on the user interface device.

The user interface device may receive information indicating a user setting, such as an image resolution setting (e.g., 3840 pixels by 2160 pixels), a frame rate setting (e.g., 60 frames per second (fps)), a location setting, and/or a context setting, which may indicate an activity, such as mountain biking, in response to user input, and may communicate the settings, or related information, to the image capture device 100.

Figure 2A:
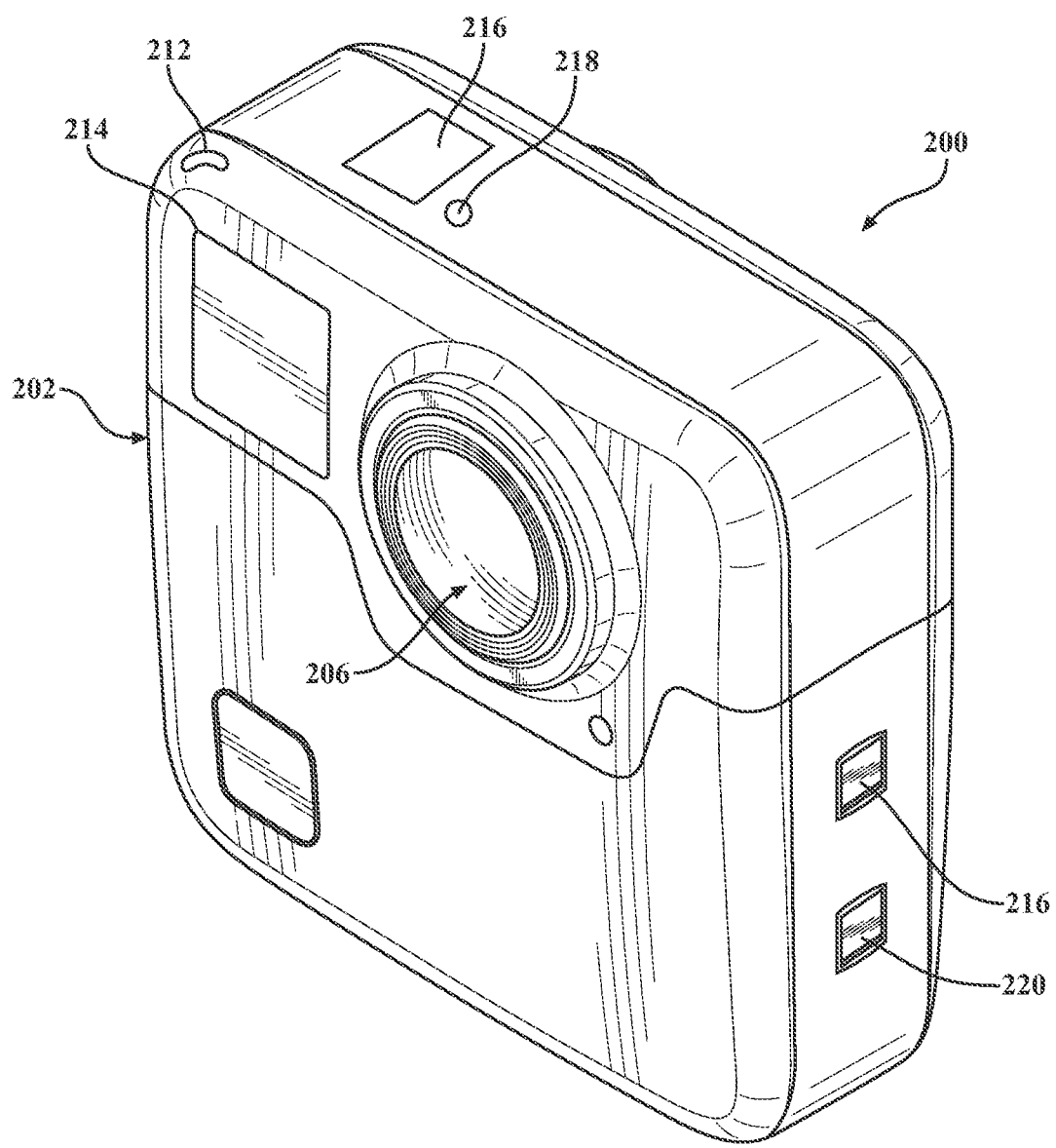
FIGS. 2A-B are isometric views of another example of an image capture device.
Figure 2B:
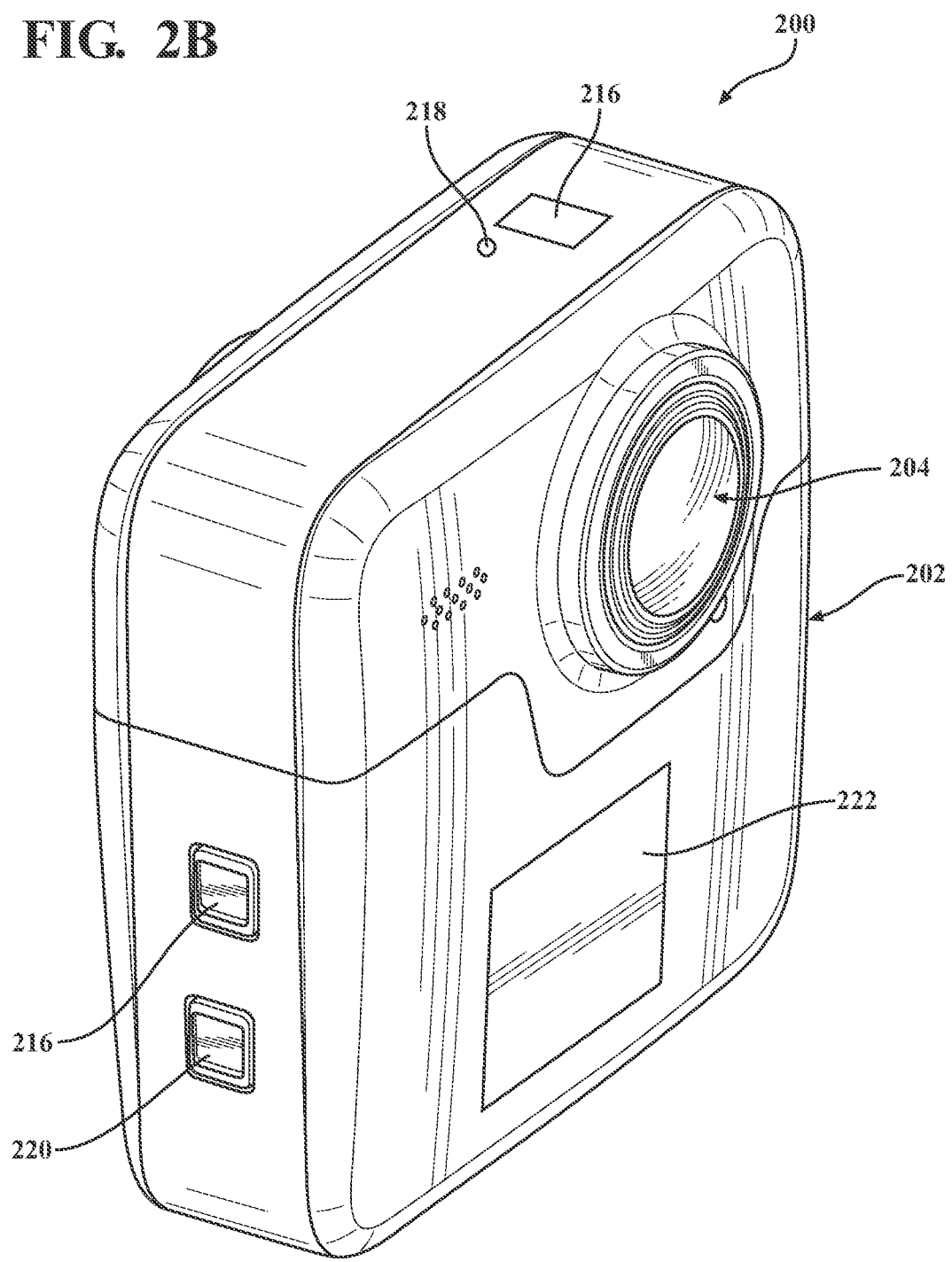

FIGS. 2A-B illustrate another example of an image capture device 200. The image capture device 200 includes a body 202 and two camera lenses 204, 206 disposed on opposing surfaces of the body 202, for example, in a back-to-back or Janus configuration. Although generally depicted as a camera, it should be appreciated that the particular configuration of the image capture device 200 may be varied in alternate embodiments of the disclosure. For example, it is envisioned that the image capture device 200 may instead take the form of a cell phone.

The image capture device may include electronics (e.g., imaging electronics, power electronics, etc.) internal to the body 202 for capturing images via the lenses 204, 206 and/or performing other functions. The image capture device may include various indicators, such as an LED light 212 and an LCD display 214.

The image capture device 200 may include various input mechanisms, such as buttons, switches, and touchscreen mechanisms. For example, the image capture device 200 may include buttons 216 configured to allow a user of the image capture device 200 to interact with the image capture device 200, to turn the image capture device 200 on, and to otherwise configure the operating mode of the image capture device 200. In an implementation, the image capture device 200 includes a shutter button and a mode button. It should be appreciated, however, that, in alternate embodiments, the image capture device 200 may include additional buttons to support and/or control additional functionality.

The image capture device 200 may also include one or more microphones 218 configured to receive and record audio signals (e.g., voice or other audio commands) in conjunction with recording video.

The image capture device 200 may include an I/O interface 220 and an interactive display 222 that allows for interaction with the image capture device 200 while simultaneously displaying information on a surface of the image capture device 200.

The image capture device 200 may be made of a rigid material such as plastic, aluminum, steel, or fiberglass. In some embodiments, the image capture device 200 described herein includes features other than those described. For example, instead of the I/O interface 220 and the interactive display 222, the image capture device 200 may include additional interfaces or different interface features. For example, the image capture device 200 may include additional buttons or different interface features, such as interchangeable lenses, cold shoes and hot shoes that can add functional features to the image capture device 200, etc.

Figure 2C:
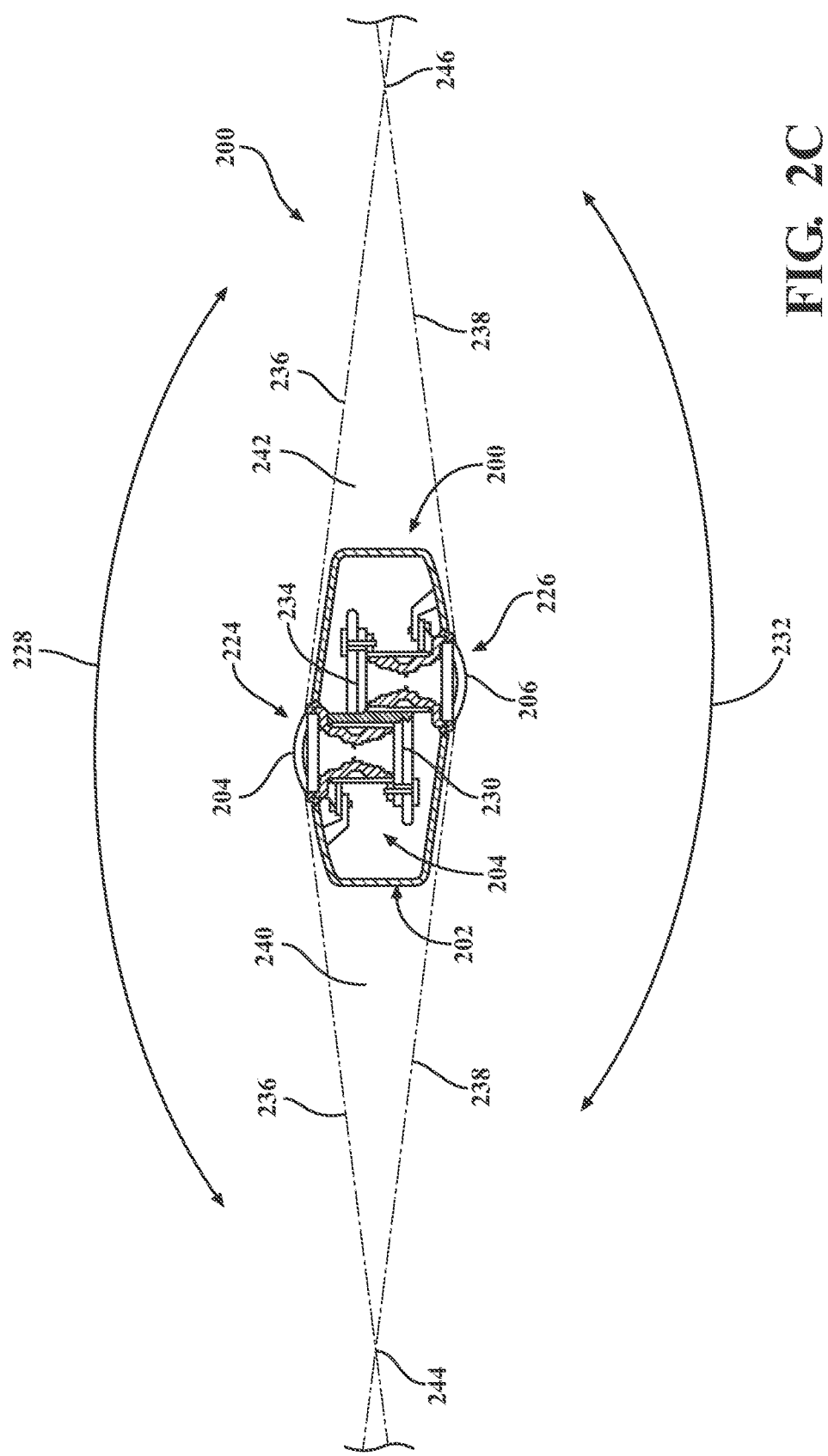
FIG. 2C is a cross-sectional view of the image capture device of FIGS. 2A-B.

FIG. 2C is a cross-sectional view of an optical module 223 of the image capture device 200 of FIGS. 2A-B. The optical module 223 facilitates the capture of spherical images, and, accordingly, includes a first image capture device 224 and a second image capture device 226. The first image capture device 224 defines a first field-of-view 228, as shown in FIG. 2C, and includes a first integrated sensor-lens assembly (ISLA) 229 that receives and directs light onto a first image sensor 230 via the lens 204. Similarly, the second image capture device 226 defines a second field-of-view 232, as shown in FIG. 2C, and includes a second ISLA 233 that receives and directs light onto a second image sensor 234 via the lens 206. To facilitate the capture of spherical images, the image capture devices 224, 226 (and related components) may be arranged in a back-to-back (Janus) configuration such that the lenses 204, 206 face in generally opposite directions.

The fields-of-view 228, 232 of the lenses 204, 206 are shown above and below boundaries 236, 238, respectively. Behind the first lens 204, the first image sensor 230 may capture a first hyper-hemispherical image plane from light entering the first lens 204, and behind the second lens 206, the second image sensor 234 may capture a second hyper-hemispherical image plane from light entering the second lens 206.

One or more areas, such as blind spots 240, 242, may be outside of the fields-of-view 228, 232 of the lenses 204, 206 so as to define a "dead zone." In the dead zone, light may be obscured from the lenses 204, 206 and the corresponding image sensors 230, 234, and content in the blind spots 240, 242 may be omitted from capture. In some implementations, the image capture devices 224, 226 may be configured to minimize the blind spots 240, 242.

The fields-of-view 228, 232 may overlap. Stitch points 244, 246, proximal to the image capture device 200, at which the fields-of-view 228, 232 overlap may be referred to herein as overlap points or stitch points. Content captured by the respective lenses 204, 206, distal to the stitch points 244, 246, may overlap.

Images contemporaneously captured by the respective image sensors 230, 234 may be combined to form a combined image. Combining the respective images may include correlating the overlapping regions captured by the respective image sensors 230, 234, aligning the captured fields-of-view 228, 232, and stitching the images together to form a cohesive combined image.

A slight change in the alignment, such as position and/or tilt, of the lenses 204, 206, the image sensors 230, 234, or both, may change the relative positions of their respective fields-of-view 228, 232 and the locations of the stitch points 244, 246. A change in alignment may affect the size of the blind spots 240, 242, which may include changing the size of the blind spots 240, 242 unequally.

Incomplete or inaccurate information indicating the alignment of the image capture devices 224, 226, such as the locations of the stitch points 244, 246, may decrease the accuracy, efficiency, or both of generating a combined image. In some implementations, the image capture device 200 may maintain information indicating the location and orientation of the lenses 204, 206 and the image sensors 230, 234 such that the fields-of-view 228, 232, the stitch points 244, 246, or both may be accurately determined, which may improve the accuracy, efficiency, or both of generating a combined image.

The lenses 204, 206 may be laterally offset from each other, may be off-center from a central axis of the image capture device 200, or may be laterally offset and off-center from the central axis. As compared to image capture devices with back-to-back lenses, such as lenses aligned along the same axis, image capture devices including laterally offset lenses may include substantially reduced thickness relative to the lengths of the lens barrels securing the lenses. For example, the overall thickness of the image capture device 200 may be close to the length of a single lens barrel as opposed to twice the length of a single lens barrel as in a back-to-back configuration. Reducing the lateral distance between the lenses 204, 206 may improve the overlap in the fields-of-view 228, 232.

Images or frames captured by the image capture devices 224, 226 may be combined, merged, or stitched together to produce a combined image, such as a spherical or panoramic image, which may be an equirectangular planar image. In some implementations, generating a combined image may include three-dimensional, or spatiotemporal, noise reduction (3DNR). In some implementations, pixels along the stitch boundary may be matched accurately to minimize boundary discontinuities.

FIGS. 3A-B are block diagrams of examples of image capture systems.

Referring first to FIG. 3A, an image capture system 300 is shown. The image capture system 300 includes an image capture device 310 (e.g., a camera or a drone), which may, for example, be the image capture device 200 shown in FIGS. 2A-C.

The image capture device 310 includes a processing apparatus 312 that is configured to receive a first image from a first image sensor 314 and receive a second image from a second image sensor 316. The image capture device 310 includes a communications interface 318 for transferring images to other devices. The image capture device 310 includes a user interface 320 to allow a user to control image capture functions and/or view images. The image capture device 310 includes a battery 322 for powering the image capture device 310. The components of the image capture device 310 may communicate with each other via the bus 324.

The processing apparatus 312 may be configured to perform image signal processing (e.g., filtering, tone mapping, stitching, and/or encoding) to generate output images based on image data from the image sensors 314 and 316. The processing apparatus 312 may include one or more processors having single or multiple processing cores. The processing apparatus 312 may include memory, such as a random-access memory (RAM) device, flash memory, or another suitable type of storage device, such as a non-transitory computer-readable memory. The memory of the processing apparatus 312 may include executable instructions and data that can be accessed by one or more processors of the processing apparatus 312.

For example, the processing apparatus 312 may include one or more dynamic random-access memory (DRAM) modules, such as double data rate synchronous dynamic random-access memory (DDR SDRAM). In some implementations, the processing apparatus 312 may include a digital signal processor (DSP). In some implementations, the processing apparatus 312 may include an application specific integrated circuit (ASIC). For example, the processing apparatus 312 may include a custom image signal processor.

The first image sensor 314 and the second image sensor 316 may be configured to detect light of a certain spectrum (e.g., the visible spectrum or the infrared spectrum) and convey information constituting an image as electrical signals (e.g., analog or digital signals). For example, the image sensors 314 and 316 may include CCDs or active pixel sensors in a CMOS. The image sensors 314 and 316 may detect light incident through a respective lens (e.g., a fisheye lens). In some implementations, the image sensors 314 and 316 include digital-to-analog converters. In some implementations, the image sensors 314 and 316 are held in a fixed orientation with respective fields-of-view that overlap.

The communications interface 318 may enable communications with a personal computing device (e.g., a smartphone, a tablet, a laptop computer, or a desktop computer). For example, the communications interface 318 may be used to receive commands controlling image capture and processing in the image capture device 310. For example, the communications interface 318 may be used to transfer image data to a personal computing device. For example, the communications interface 318 may include a wired interface, such as a high-definition multimedia interface (HDMI), a universal serial bus (USB) interface, or a FireWire interface. For example, the communications interface 318 may include a wireless interface, such as a Bluetooth interface, a ZigBee interface, and/or a Wi-Fi interface.

The user interface 320 may include an LCD display for presenting images and/or messages to a user. For example, the user interface 320 may include a button or switch enabling a person to manually turn the image capture device 310 on and off. For example, the user interface 320 may include a shutter button for snapping pictures.

The battery 322 may power the image capture device 310 and/or its peripherals. For example, the battery 322 may be charged wirelessly or through a micro-USB interface.

The image capture system 300 may be used to implement some or all of the techniques described in this disclosure.

Referring to FIG. 3B, another image capture system 330 is shown. The image capture system 330 includes an image capture device 340 and a personal computing device 360 that communicate via a communications link 350. The image capture device 340 may, for example, be the image capture device 100 shown in FIGS. 1A-D. The personal computing device 360 may, for example, be the user interface device described with respect to FIGS. 1A-D.

The image capture device 340 includes an image sensor 342 that is configured to capture images. The image capture device 340 includes a communications interface 344 configured to transfer images via the communication link 350 to the personal computing device 360.

The personal computing device 360 includes a processing apparatus 362 that is configured to receive, using a communications interface 366, images from the image sensor 342. The processing apparatus 362 may be configured to perform image signal processing (e.g., filtering, tone mapping, stitching, and/or encoding) to generate output images based on image data from the image sensor 342.

The image sensor 342 is configured to detect light of a certain spectrum (e.g., the visible spectrum or the infrared spectrum) and convey information constituting an image as electrical signals (e.g., analog or digital signals). For example, the image sensor 342 may include CCDs or active pixel sensors in a CMOS. The image sensor 342 may detect light incident through a respective lens (e.g., a fisheye lens). In some implementations, the image sensor 342 includes digital-to-analog converters. Image signals from the image sensor 342 may be passed to other components of the image capture device 340 via a bus 346.

The communications link 350 may be a wired communications link or a wireless communications link. The communications interface 344 and the communications interface 366 may enable communications over the communications link 350. For example, the communications interface 344 and the communications interface 366 may include an HDMI port or other interface, a USB port or other interface, a FireWire interface, a Bluetooth interface, a ZigBee interface, and/or a Wi-Fi interface. For example, the communications interface 344 and the communications interface 366 may be used to transfer image data from the image capture device 340 to the personal computing device 360 for image signal processing (e.g., filtering, tone mapping, stitching, and/or encoding) to generate output images based on image data from the image sensor 342.

The processing apparatus 362 may include one or more processors having single or multiple processing cores. The processing apparatus 362 may include memory, such as RAM, flash memory, or another suitable type of storage device, such as a non-transitory computer-readable memory. The memory of the processing apparatus 362 may include executable instructions and data that can be accessed by one or more processors of the processing apparatus 362. For example, the processing apparatus 362 may include one or more DRAM modules, such as DDR SDRAM.

In some implementations, the processing apparatus 362 may include a DSP. In some implementations, the processing apparatus 362 may include an integrated circuit, for example, an ASIC. For example, the processing apparatus 362 may include a custom image signal processor. The processing apparatus 362 may exchange data (e.g., image data) with other components of the personal computing device 360 via a bus 368.

The personal computing device 360 may include a user interface 364. For example, the user interface 364 may include a touchscreen display for presenting images and/or messages to a user and receiving commands from a user. For example, the user interface 364 may include a button or switch enabling a person to manually turn the personal computing device 360 on and off. In some implementations, commands (e.g., start recording video, stop recording video, or capture photo) received via the user interface 364 may be passed on to the image capture device 340 via the communications link 350.

The image capture system 330 may be used to implement some or all of the techniques described in this disclosure.

Referring now to FIGS. 4A-4E, a door assembly 400 will be discussed, which represents an alternate embodiment of the aforedescribed door 115 (FIG. 1B). More specifically, FIG. 4A provides a side, plan view of the image capture device 100 with the door assembly 400 shown in a closed, locked position; FIG. 4B provides a front, perspective view of the image capture device 400 with the door assembly 400 shown in the closed, locked position; FIG. 4C provides a side, plan view of the image capture device 100 with the door assembly 400 shown in a closed, unlocked position; FIG. 4D provides a side, plan view of the image capture device 100 with the door assembly 400 shown in the open position; and FIG. 4E provides a front, plan view of the image capture device 100 with the door assembly 400 shown in the open position. Although generally discussed in connection with the image capture device 100 hereinbelow, it should be appreciated that the door assembly 400 may be configured for use with any image capture device, such as the various embodiments described herein (e.g., the aforedescribed image capture devices 200, 300).

The door assembly 400 is rotatably (e.g., pivotably) connected to the body 102 of the image capture device 100 such that the door assembly 400 is movable (repositionable) between the closed position (FIGS. 4A-4C) and the open position (FIGS. 4D, 4E) to reveal and conceal a peripheral cavity 122 defined by the body 102 of the image capture device 100. As seen in FIG. 4D, the peripheral cavity 122 may include, accommodate, or otherwise provide access to one or more components C of the image capture device 100, including, for example, a power source 124 for the image capture device 100 (e.g., the aforementioned battery 322); an accessory port 126; the aforementioned I/O interface 114 (FIG. 1B); a USB-C connector 128; etc.

The door assembly 400 completes the exterior of the image capture device 100, and, in the illustrated embodiment, extends partially along a side (e.g., the left face 102b) of the image capture device between opposite (upper and lower) radiused corner sections 130u, 130l. More specifically, the door assembly 400 includes an upper (proximal) end 402u that is pivotably connected to the body 102 at a location between the top face 102e and the bottom face 102f, and a lower (distal) end 402l that terminates at (or adjacent to) the corner section 130u such that the lower end 402l is positioned at (or adjacent to) the corner section 130l (when the door assembly 400 is in the closed position) generally proximate (e.g., adjacent) to the bottom face 102f of the image capture device 100.

Figure 5:
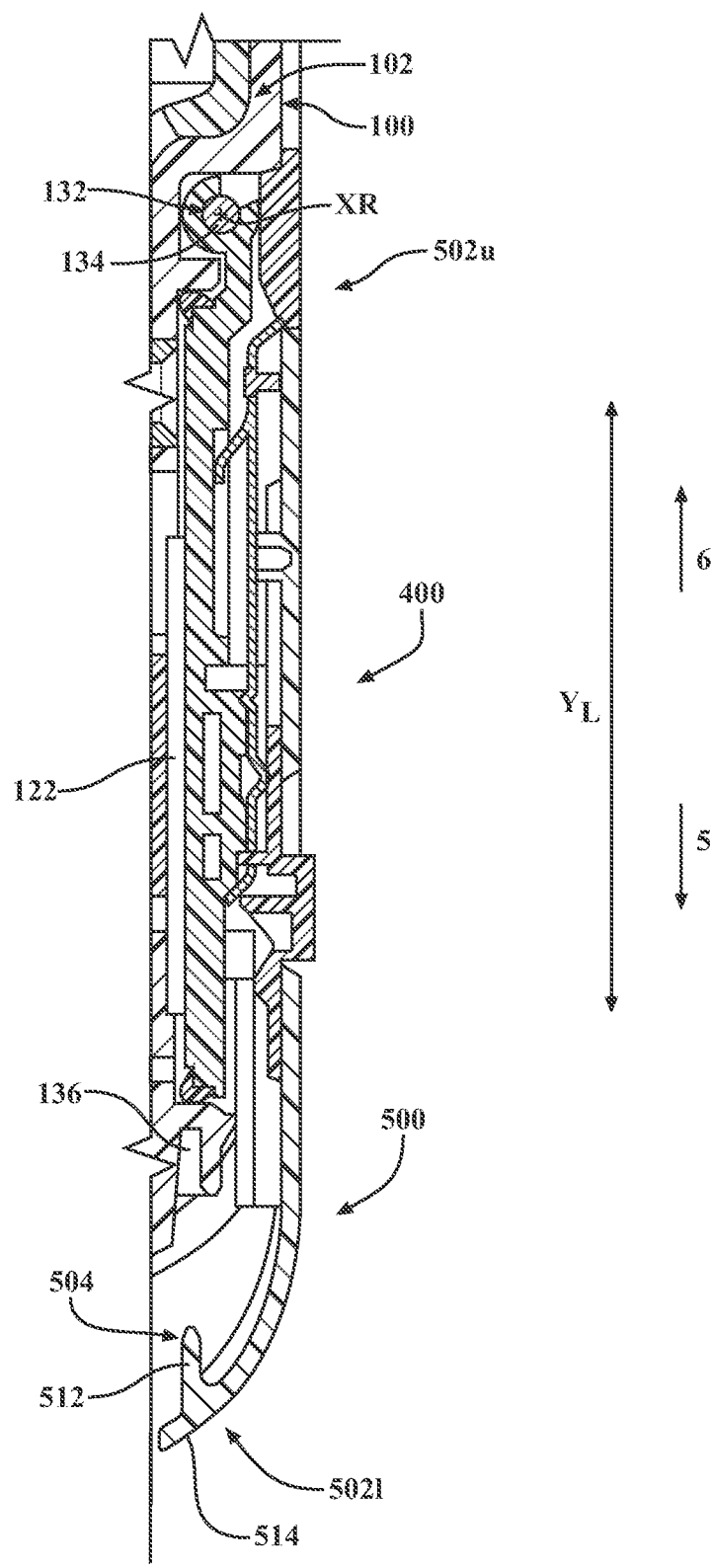
FIG. 5 is a partial (vertical) cross-sectional view illustrating connection of the door assembly to the image capture device with the door assembly shown in the unlocked position.
Figure 6:
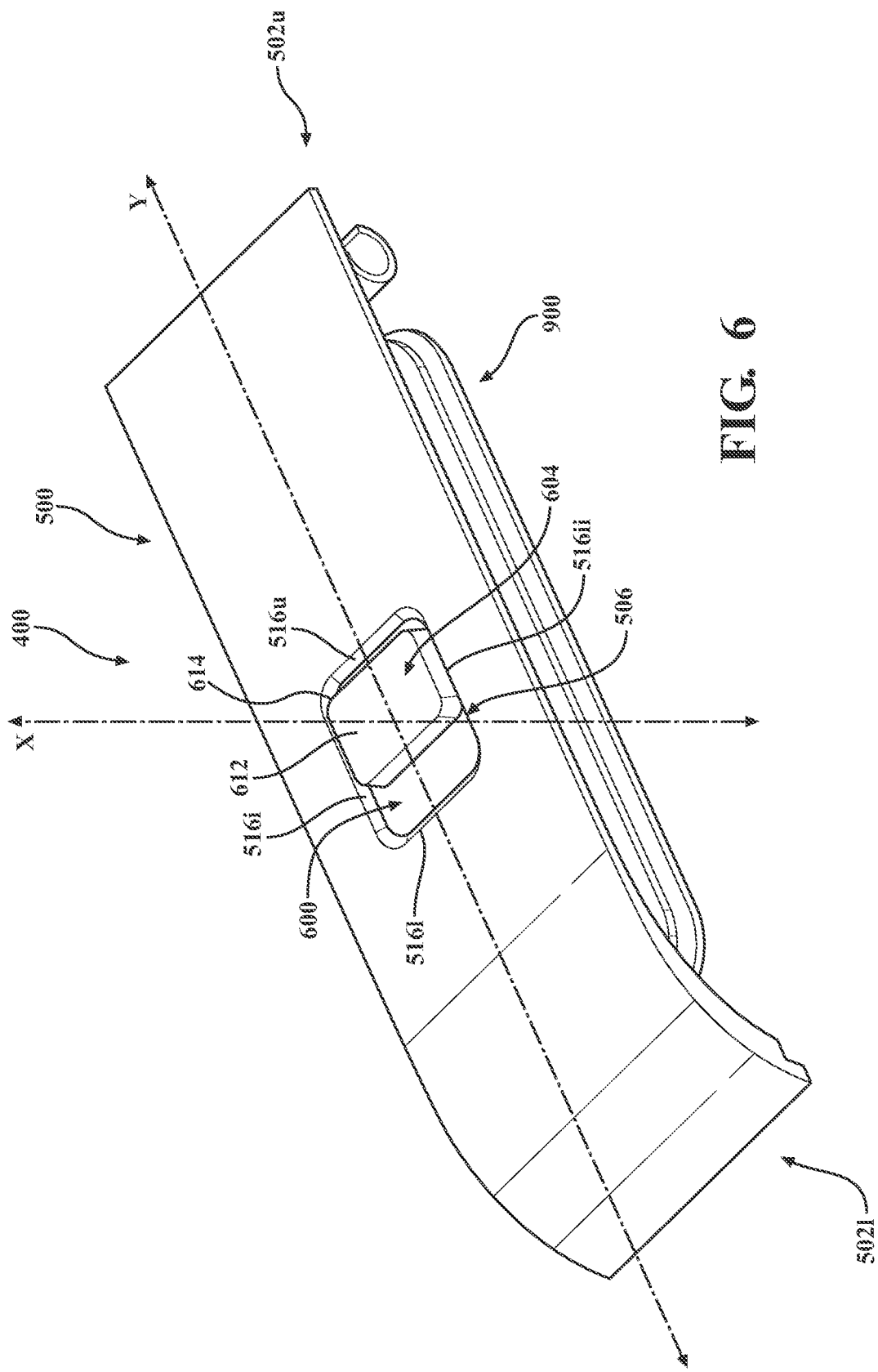
FIG. 6 is a side, perspective view of the door assembly shown separated from the image capture device.
Figure 7:
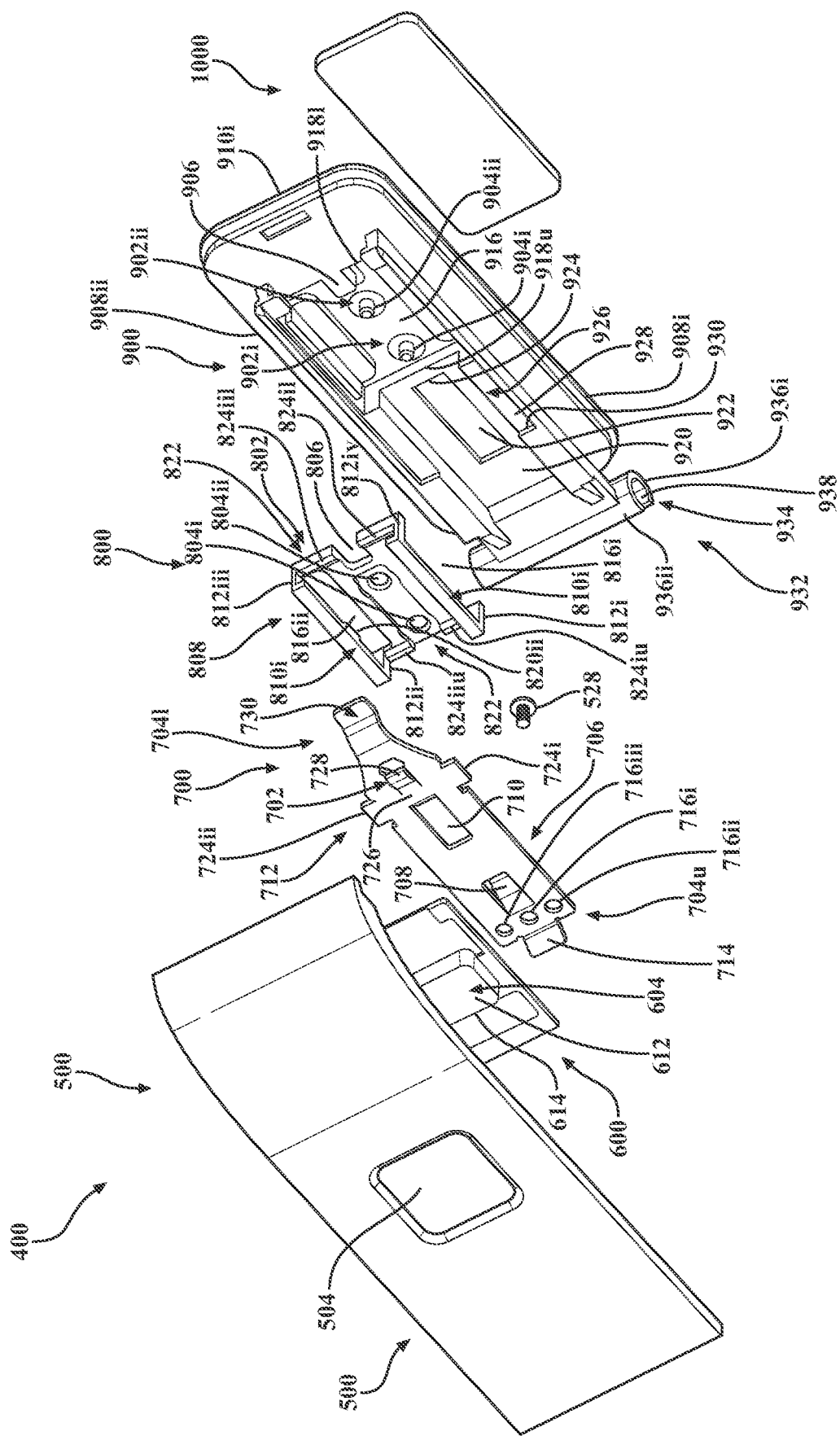
FIG. 7 is a top, perspective view of the door assembly with parts separated.
Figure 8:
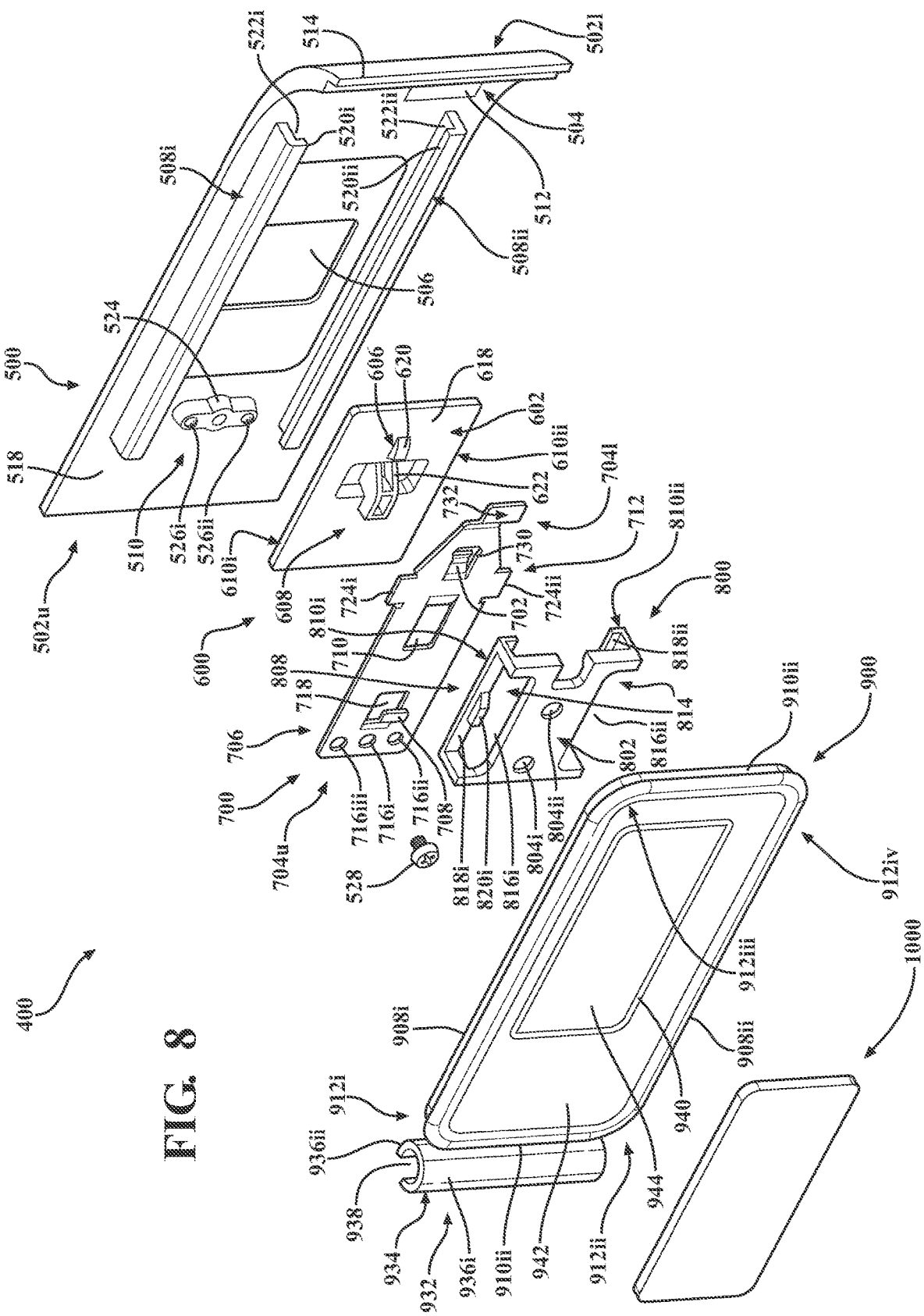
FIG. 8 is a bottom, perspective view of the door assembly with parts separated.
Figure 9:
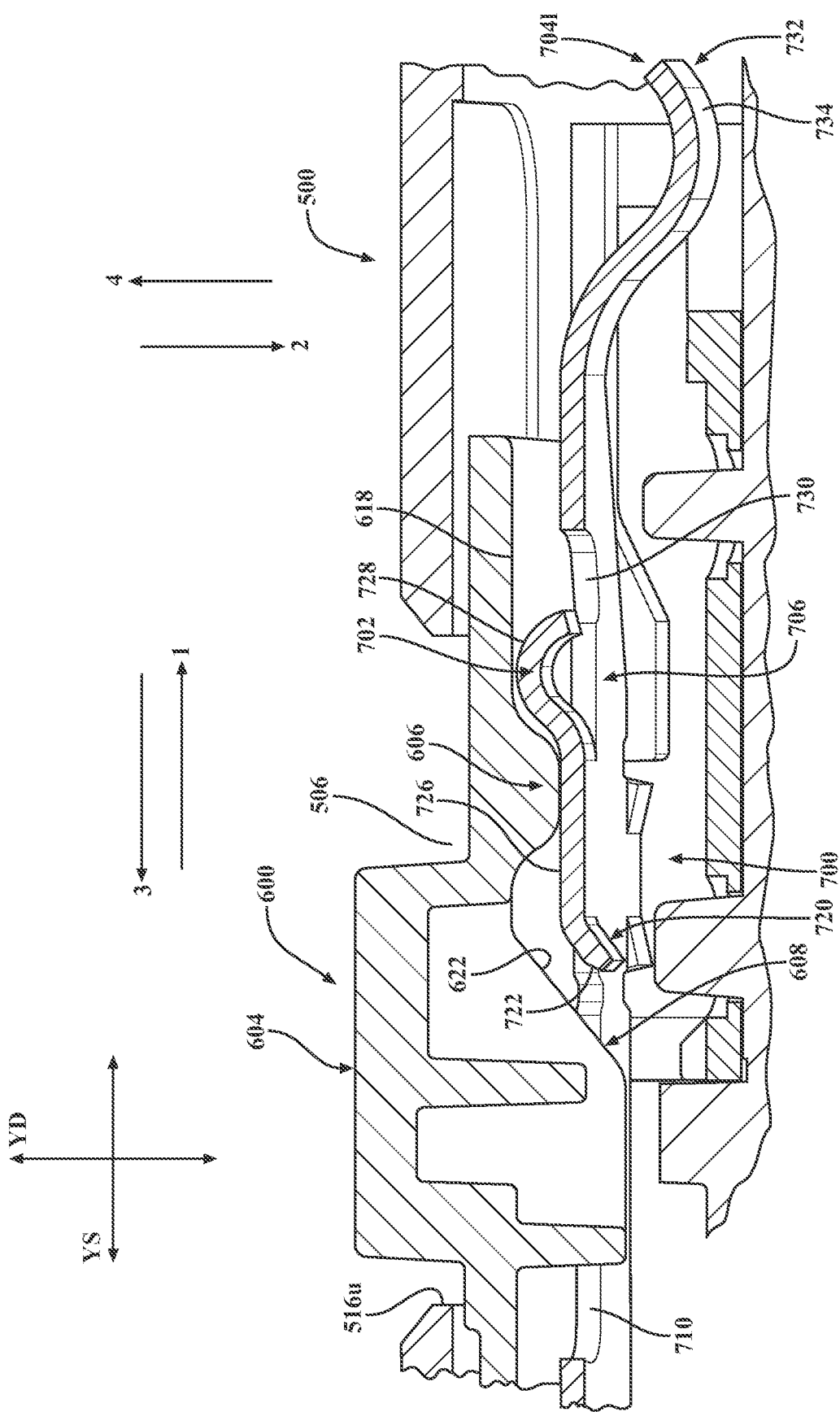
FIG. 9 is a partial (vertical) cross-sectional view showing the door assembly in the locked position.
Figure 10:
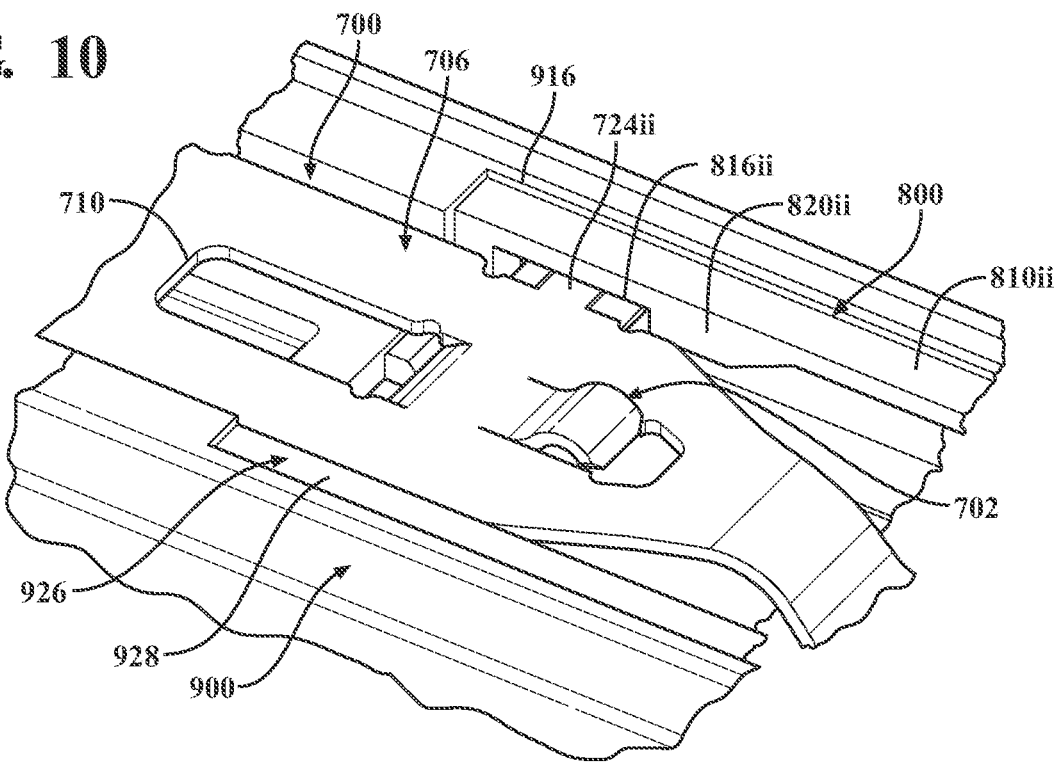
FIG. 10 is a partial, top, perspective view showing the door assembly in the locked position.
Figure 11:
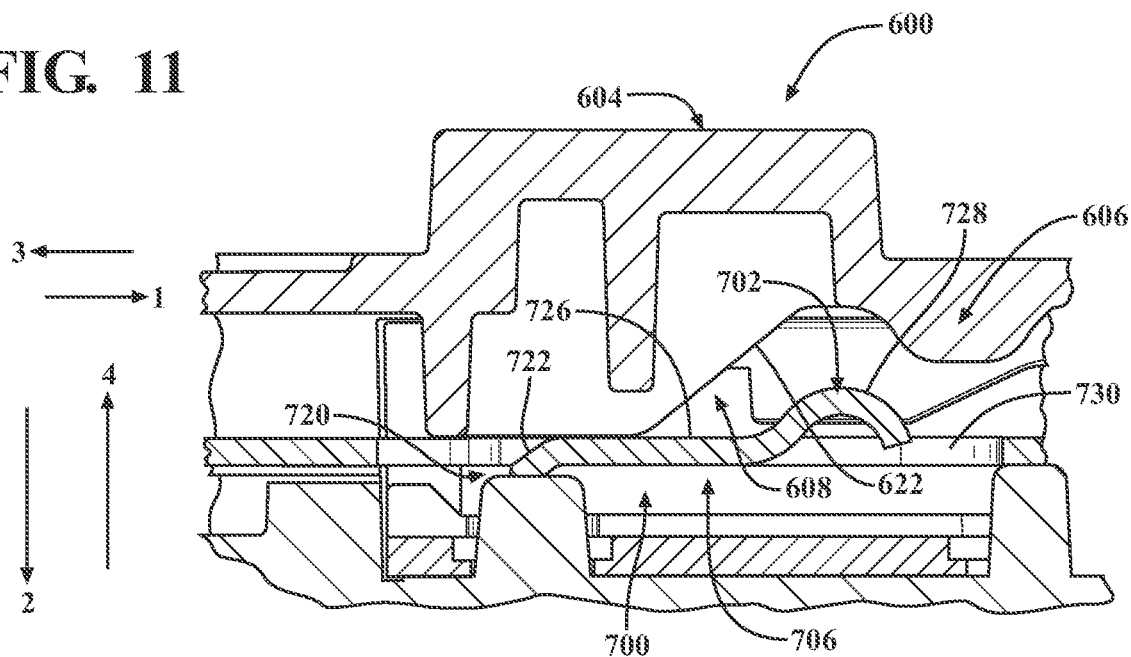
FIG. 11 is a partial (vertical) cross-sectional view showing the door assembly in the unlocked position.
Figure 12:
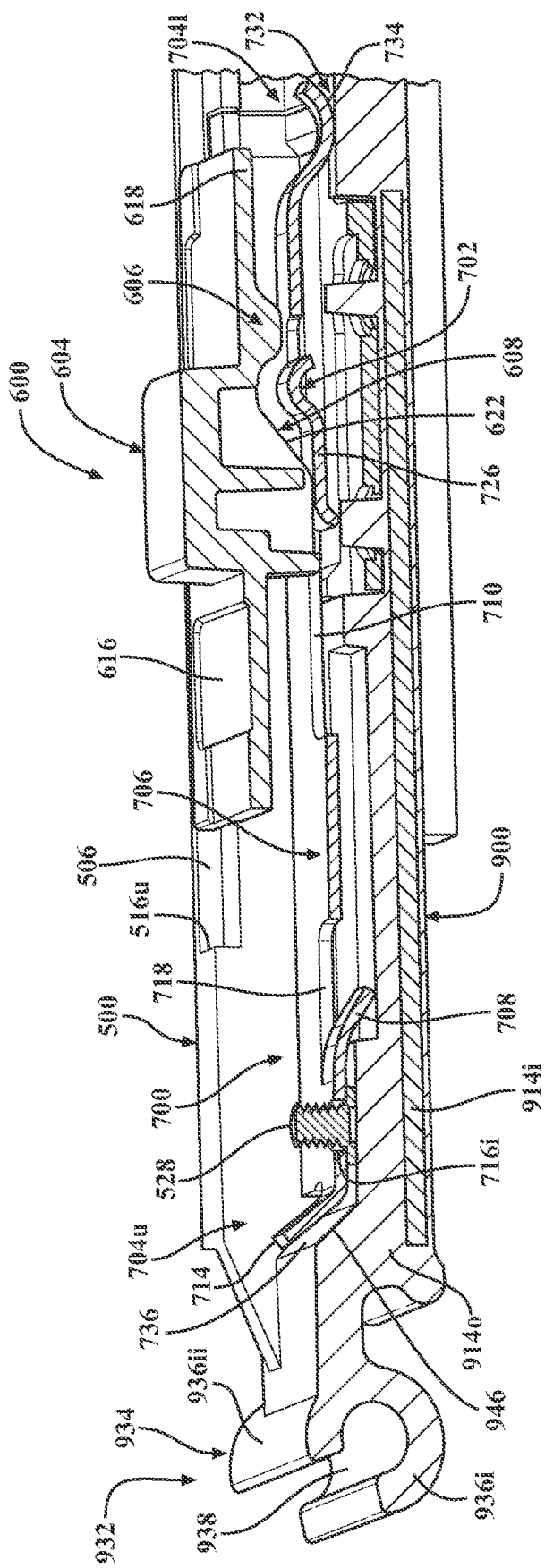
FIG. 12 is a partial, perspective (vertical) cross-sectional view showing the door assembly in the unlocked position.

With reference to FIGS. 5-12 as well, the door assembly 400 defines a longitudinal axis Y and includes a door body 500; a slider 600; a biasing member 700; a door lock 800; a sealing member 900; and a spacer 1000 that is supported by (e.g., secured to) the sealing member 900. More specifically, FIG. 5 provides a partial (vertical) cross-sectional view showing connection of the door assembly 400 to the image capture device 100 via a pivot member 132 (e.g., a hinge pin 134) with the door assembly 400 shown in a closed, unlocked position; FIG. 6 provides a side, perspective view of the door assembly 400 shown separated from the image capture device 100; FIGS. 7 and 8 provide top and bottom, respectively, perspective views of the door assembly 400 with parts separated; FIG. 9 provides a partial, (vertical) cross-sectional view showing the door assembly 400 in a closed, locked position; FIG. 10 provides a partial, top, perspective view showing the door assembly 400 in the closed, locked position; FIG. 11 provides a partial (vertical) cross-sectional view showing the door assembly 400 in the closed, unlocked position; and FIG. 12 provides a partial, perspective, (vertical) cross-sectional view showing the door assembly 400 in the closed, unlocked position.

The door body 500 may include any suitable material or combination of materials, and may be formed through any suitable method of manufacture. In the particular embodiment shown throughout the figures, for example, the door body 500 includes a metallic material (e.g., stainless steel, aluminum, etc.), and is formed via injection molding. The door body 500 is movable between locked and unlocked (first and second) positions along an axis of movement YL that extends in generally parallel relation to the longitudinal axis Y of the door assembly 400 to lock and unlock the door assembly 400, and includes respective upper and lower (proximal and distal) ends 502u, 502l; a locking member 504; a window 506; rails 508; and a boss structure 510.

The locking member 504 (FIGS. 4E, 5, 8) is positioned at the lower end 502l of the door body 500, and is configured for insertion into, and removal from, a corresponding receptacle 136 (FIG. 5) in the housing 102 of the image capture device 100 such that the locking member 504 is engageable (in contact) with and disengageable from (out of contact with) the housing 102 during movement of the door body 500 between the unlocked and locked positions. More specifically, when the door body 500 is in the locked position, the locking member 504 is positioned within the receptacle 136 in the housing 102 of the image capture device 100 to rotationally fix the door assembly 400 in relation to the housing 102, and, thus, maintain the door assembly 400 in the closed position. By contrast, when the door assembly 500 is in the unlocked position, the locking member 504 is removed from the receptacle 136, which permits rotation of the door assembly 400 in relation to the housing 102, and, thus, movement of the door assembly 400 into the open position.

In the particular embodiment shown throughout the figures, the locking member 504 is configured as a tooth 512 that is configured for insertion into a receptacle 136 (e.g., a channel or other such surface irregularity) defined by the housing 102. It should be appreciated, however, that the particular configuration of the locking member 504 and the receptacle 136 may be varied in alternate embodiments without departing from the scope of the present disclosure. The locking member 504 extends upwardly (vertically) from a (distal) end wall 514 (FIG. 8) of the door body 500 (e.g., in generally parallel relation to the axis of movement YL (FIG. 5) of the door body 500 in transitioning between the unlocked and locked positions). As can be appreciated through reference to FIGS. 4B, 5, and 9, the end wall 514 is arcuate in configuration so as to match the overall exterior contour defined by the housing 102, whereby the end wall 514 sits flush with the bottom face 102f of the image capture device 100 when the door assembly 400 is closed and the door body 500 is in the locked position.

The window 506 in the door body 500 is configured to receive the slider 600 such that the slider 600 is axially movable in relation to (and independently of) the door body 500. More specifically, the window 506 is defined by respective upper and lower edges 516u, 516l and side edges 516i, 516ii, and accommodates the slider 600 during movement between a first position (FIGS. 4A, 4B), in which the door body 500 is axially fixed in relation to the body 102 of the image capture device 100 to inhibit (if not entirely prevent) opening of the door assembly 400, and a second position (FIG. 4C), in which the door body 500 is axially movable in relation to the body 102 of the image capture device 100 to allow for opening of the door assembly 400, as described in further detail below.

The rails 508 extend from an inner surface 518 of the door body 500 (i.e., towards the sealing member 900) in generally parallel relation, and each rail 508 includes a shoulder 520 so as to define a channel 522. More specifically, in the illustrated embodiment, the door body 500 includes a first rail 508i with a shoulder 520i that defines a channel 522i, and a second rail 508ii with a shoulder 520ii that defines a channel 522ii. The slider 600 is configured for positioning within the channels 522i, 522ii such that the slider 600 is supported by the door body 500. Although shown as being integrally formed with the door body 500 in the illustrated embodiment, it should be appreciated that the rails 508 may be formed as separate, discrete components that may be secured to the door body 500 (e.g., via adhesive, welding, etc.) without departing from the scope of the present disclosure.

The boss structure 510 includes a boss 524 and a pair of detents 526i, 526ii. The boss 524 is configured to receive a corresponding fastener 528 (e.g., a screw, pin, etc.) to secure the biasing member 700 to the door body 500, as described in further detail below, such that the slider 600 is positioned between the door body 500 and the biasing member 700. The detents 526 are positioned laterally outward of the boss 524 and are configured for engagement (contact) with the biasing member 700 to inhibit (if not entirely prevent) rotation of the biasing member 700 within the door assembly 400 (e.g., relative to the door body 500). Although illustrated as being generally arcuate in configuration, it should be appreciated that the detents 526i, 526ii may be configured in any manner suitable for the intended purpose of inhibiting rotation of the biasing member 700. For example, embodiments in which the detents 526i, 526ii may be configured as posts or the like would not be beyond the scope of the present disclosure.

While the boss structure 510 is shown as being integrally formed with the door body 500 in the illustrated embodiment, it should be appreciated that the boss structure 510 may be formed as a separate, discrete component that may be secured to the door body 500 (e.g., via adhesive, welding, etc.) without departing from the scope of the present disclosure.

The slider is configured for manual manipulation by a user to facilitate unlocking of the door body 500 and the door assembly 400, as described in further detail below, and may be formed through any suitable method of manufacture using any suitable material or combination of materials. In the particular embodiment shown throughout the figures, for example, the slider 600 is formed from a metallic material (e.g., stainless steel, aluminum, etc.), and includes a body 602 supporting a tactile member 604; a deflector 606; and a ramp 608.

The body 602 of the slider 600 includes side portions 610i, 610ii that are configured for receipt within the channels 522i, 522ii respectively defined by the rails 508i, 508ii on the door body 500. More specifically, the shoulders 520i, 520ii support the body 602 of the slider 600 such that the slider 600 is axially movable between the first position (FIGS. 4A, 4B), which corresponds to the locked position of the door body 500, and the second position (FIG. 4C), which corresponds to the unlocked position of the door body 500 along an axis of movement YS (FIG. 9) that extends in generally parallel relation to the axis of movement YL of the door body 500 and the longitudinal axis Y of the door assembly 400. Movement of the slider 600 from the first position to the second position thus facilitates unlocking of the door assembly 400, further details of which are provided below.

To facilitate movement of the slider 600 between the first position and the second position, the slider 600 includes the tactile member 604. The tactile member 604 is configured for manual engagement by a user and allows for the application of a suitable force to the biasing member 700 to manually unlock the door body 500, and, thus, the door assembly 400, as described in detail below. For example, in the illustrated embodiment, the tactile member 604 is configured as a button (switch) 612 defining a finger grab 614 and extends through the window 506 in the door body 500.

In certain embodiments, the slider 600 may include a visual indicator 616 (FIG. 4C) (e.g., a colored strip of material, different texturing, etc.) to identify whether the door assembly 400 is locked or unlocked. For example, when the slider 600 is in the first position (e.g., when the door assembly 400 is locked), the visual indicator 616 may be concealed by the door body 500. Upon movement into the second position (e.g., when the door assembly 400 is unlocked), however, the visual indicator 616 may become visible through the window 506 in the door body 500 to signify to the user that the door assembly 400 has been unlocked.

The deflector 606 extends inwardly from an inner surface 618 (FIG. 8) of the slider 600 (i.e., away from the door body 500) for engagement (contact) with a corresponding deflector 702 included on the biasing member 700 to facilitate deflection of the biasing member 700, as discussed below, and may include any structure suitable for this intended purpose. More specifically, in the particular embodiment shown throughout the figures, the deflector 606 includes an arcuate (curved) projection 620. It should be appreciated however, that the configuration of the deflector 606 may be varied in alternate embodiments without departing from the scope of the present disclosure.

The ramp 608 is spaced axially (longitudinally) from the deflector 606, and, more specifically, is positioned proximally from (vertically above) the deflector 606. The ramp 608 extends inwardly (i.e., away from the door body 500) from the body 602 of the slider 600 and defines an angled surface 622 that is configured for engagement (contact) with the biasing member 700, details of which are provided below. Engagement (contact) between the ramp 608 and the biasing member 700 facilitates not only deflection of the biasing member 700, as discussed below, but movement of the slider 600 relative to the biasing member 700 (and the door body 500) as the slider 600 moves from the first position to the second position.

With continued reference to FIGS. 1-12, the biasing member 700 will be discussed. The biasing member 700 may include any suitable material or combination of materials, and may be formed through any suitable method of manufacture (e.g., stamping, injection molding, machining, etc.). For example, in the particular embodiment shown throughout the figures, the biasing member 700 is integrally (e.g., monolithically) formed from a resilient (e.g., flexible) metallic material (e.g., spring steel, aluminum, etc.).

In the illustrated embodiment, the biasing member 700 is configured as a spring plate that includes opposite upper and lower (first and seconds) end 704*u*, 704*l*; a body portion 706 that is positioned between the ends 704*u*, 704*l*; a finger 708; an opening 710; one or more retention structures 712; and the aforementioned deflector 702.

The upper end 704*u* of the biasing member 700 is axially (vertically) fixed to the door body 500 and includes a flange 714 that extends outwardly (i.e. towards the door body 500). The upper end 704*u* of the biasing member 700 defines openings 716*i*, 716*ii*, 716*iii* that are configured to secure the biasing member 700 to the door body 500. More specifically, the opening 716*i* is configured to receive the fastener 528 such that the fastener 528 extends through the opening 716*i* and into the boss 524 to fixedly connect the biasing member 700 to the door body 500, and the openings 716*ii*, 716*iii* are configured to receive the detents 526*i*, 526*ii* extending from the boss structure 510 on the door body 500, respectively. Receipt of the detents 526*i*, 526*ii* by the openings 716*ii*, 716*iii* inhibits (if not entirely prevents) rotation of the biasing member 700 within the door assembly 400 (e.g., relative to the door body 500), as mentioned above.

The finger 708 extends inwardly (i.e., away from the door body 500) from the body portion 706 of the biasing member 700 and is configured for engagement (contact) with the sealing member 900 to limit (vertical) travel of the biasing member 700 and the door body 500, as described in further detail below. In the particular embodiment shown throughout the figures, the finger 708 is illustrated as being integrally (e.g., monolithically) formed with the body portion 706 of the biasing member 700, whereby the body portion 706 defines an opening 718 (FIG. 8). It should be appreciated, however, that the finger 708 may be formed as a separate, discrete component that is secured to the body portion 706 (e.g., via adhesive, welding, etc.) without departing from the scope of the present disclosure (e.g., so as to eliminate the opening 718).

As seen in FIG. 9, the opening 710 defined by the body portion 706 of the biasing member 700 is configured to receive the ramp 608 of the slider 600 such that, when the slider 600 is in the first position, as shown in FIG. 9, the ramp 608 extends through the biasing member 700. More specifically, the ramp 608 extends through the opening 710 such that the angled surface 622 is positioned for engagement (contact) with an end wall 720 defining the opening 710. As the slider 600 moves from the first position into the second position, the angled surface 622 of the ramp 608 traverses the end wall 720, thereby deflecting the biasing member 700 inwardly (i.e., away from the door body 500). To encourage deflection of the biasing member 700, as seen in FIG. 9, for example, the end wall 720 defining the opening 710 may include a beveled surface 722 that extends inwardly (i.e., away from the door body 500) in correspondence with the configuration of the angled surface 622. For example, it is envisioned that the angle defined by the beveled surface 722 may be substantially similar or identical to the angle defined by the angled surface 622.

In the embodiment of the disclosure shown throughout the figures, the ramp 608 is illustrated as including a generally polygonal (e.g., rectangular) longitudinal (vertical) cross-sectional configuration. Consequently, the opening 710 is configured in a corresponding generally polygonal (e.g., rectangular) manner to facilitate receipt of the ramp 608 by the opening 710. It should be appreciated, however, that the particular configurations of the ramp 608 and the opening 710 may be varied in alternate embodiments without departing from the scope of the present disclosure.

The retention structure(s) 712 extend laterally outward from the body portion 706 of the biasing member 700 in generally orthogonal relation to the longitudinal axis Y (FIG. 6) of the door assembly 400. More specifically, in the embodiment of the disclosure shown throughout the figures, the retention structure(s) 712 include a pair of wings 724*i*, 724*ii* that extend laterally outwardly from the body portion 706 of the biasing member 700. Although shown as being integrally formed with the body portion 706 of the biasing member 700 in the illustrated embodiment, it should be appreciated that the retention structure(s) 712 may be formed as separate, discrete component(s) that are secured to the body portion 706 (e.g., via adhesive, welding, etc.) without departing from the scope of the present disclosure. Additionally, although shown as including two wings 724, an embodiment including only a single wing 724 would also be within the scope of the present disclosure.

The deflector 702 is spaced axially (distally) from the opening 710 at a location vertically below the opening 710 so as to define a support surface 726 that is configured for engagement (contact) with the deflector 606 on the slider 600. The deflector 702 extends outwardly (i.e., towards the door body 500) from the body portion 706 for engagement (contact) with the inner surface 618 of the slider 600 at a location distal to (vertically below) the deflector 606. As discussed in further detail below, engagement (contact) between the biasing member 700 and the slider 600 (e.g., engagement (contact) between the support surface 726 and the deflector 606 and engagement (contact) between the deflector 702 and the inner surface 618) maintains the lateral (horizontal) position of the slider 600 such that the slider 600 remains positioned within the window 506 in the door body 500 in the manner illustrated in FIGS. 9 and 10, for example.

As mentioned above, the deflector 702 is configured for engagement (contact) with the deflector 606 included on the slider 600 to facilitate deflection of the biasing member 700 as the slider 600 moves from the first position to the second position, and may include any structure suitable for this intended purpose. More specifically, the deflector 702 extends outwardly from the body portion 706 of the biasing member 700 (i.e., towards the door body 500) such that the deflectors 606, 702 extend in opposing directions. In the particular embodiment shown throughout the figures, the deflector 702 includes an arcuate (curved) projection 728 that generally corresponds in configuration to the projection 620. As mentioned in connection with the deflector 606, however, it should be appreciated that the configuration of the deflector 702 may be varied in alternate embodiments without departing from the scope of the present disclosure. Additionally, while the deflector 702 is illustrated as being integrally (e.g., monolithically) formed with the body portion 706 of the biasing member 700 in the particular embodiment shown throughout the figures, whereby the biasing member 700 includes an additional opening 730, it should be appreciated that the deflector 702 may be formed as a separate, discrete component that may be secured to the body portion 706 of the biasing member 700 (e.g., via adhesive, welding, etc.) without departing from the scope of the present disclosure (e.g., so as to eliminate the opening 730).

Movement of the slider 600 from the first position (FIG. 9) to the second position (FIG. 11) (in the direction indicated by arrow 1) causes corresponding deflection (movement) of the biasing member 700 from an initial (first) configuration (FIG. 9) to a deflected (second) configuration along an axis YD (FIG. 9) that extends in generally orthogonal relation to the axis of movement YL of the door body 500, the axis of movement YS of the slider 600, and the longitudinal axis Y of the door assembly 400. In the initial configuration, the biasing member 700 is spaced a first (lateral) distance from the door body 500, whereas in the deflected (second) configuration (FIGS. 11, 12), the biasing member 700 is spaced a second (lateral) distance from the door body 500 that is greater than the first distance. Movement of the slider 600, however, is resisted by the deflector 702 on the biasing member 700 (by virtue of the fixed axial connection between the biasing member 700 and the door body 500 established by the fastener 528 and the boss 524) until a threshold force is applied to the slider 600 sufficient to cause the deflector 606 to traverse (move across) the deflector 702. The resistance to movement of the slider 600 provided by the biasing member 700 inhibits (if not entirely prevents) accidental or unwanted movement of the slider 600 into the second position (e.g., in the event that the image capture device 100 is dropped), and, thus, inadvertent (e.g., accidental or unwanted) unlocking and opening of the door assembly 400.

Upon application of the threshold force, the deflectors 606, 702 bear against one another as the deflector 606 traverses the deflector 702, and the ramp 608 moves towards the end wall 720 defining the opening 710 in the body portion 706 of the biasing member 700. As the deflectors 606, 702 bear against one another, lateral (outward) movement of the slider 600 (i.e., movement away from the biasing member 700 and towards the door body 500) is resisted by the door body 500, which allows the lateral position of the slider 600 to remain relatively constant within the door assembly 400. As a result, movement of the slider 600 deflects the biasing member 700 inwardly (i.e., away from the door body 500) in the direction indicated by arrow 2. Continued movement of the slider 600 towards the second position (in the direction indicated by arrow 1) causes engagement of (contact between) the angled surface 622 of the ramp 608 and the end wall 720, which results in further (inward) deflection of the biasing member 700 and withdrawal of the ramp 608 from the opening 710. Upon withdrawal of the ramp 608 from the opening 710, continued movement of the slider 600 towards the second position (in the direction indicated by arrow 1) results in positioning of an inner surface 624 of the ramp 608 in contact with the support surface 726 of the body portion 706 of the biasing member 700, as seen in FIGS. 11 and 12. Movement of the biasing member 700 from the initial configuration (FIG. 9) to the deflected configuration (FIGS. 11, 12) is thus caused by movement of the slider 600 from the first position to the second position, and the resultant contact between the deflectors 606, 702, the ramp 608, and the end wall 720 defining the opening 710 in the body portion of the biasing member 700.

Oppositely, as the slider 600 moves from the second position to the first position (in the direction indicated by arrow 3), the inner surface 624 of the ramp 608 traverses the support surface 726 of the body portion 706 of the biasing member 700, during which, the deflector 606 passes the deflector 702. When the ramp 608 reaches the opening 710 formed in the body portion 706, the angled surface 622 traverses the end wall 720 as the ramp 608 re-enters the opening 710. As the ramp 608 re-enters the opening 710, the deflector 606 is brought into contact with the deflector 702 as the biasing member 700 moves outwardly (i.e., towards the door body 500) in the direction indicated by arrow 4 during return to its normal configuration (FIG. 9) from the deflected configuration. As the normal configuration of the biasing member 700 is restored, which is facilitated by the inclusion of resilient material(s) in construction of the biasing member 700, the (lateral) distance between the biasing member 700 and the door body 500 is reduced.

The lower end 704l of the biasing member 700 includes a flange 732 that is configured for engagement (contact) with the sealing member 900. More specifically, the flange 732 includes an arcuate (curved) end 734 that bears against the sealing member 900 to create and apply an outwardly directed force to the biasing member 700 (i.e., a force directed towards the door body 500). The outwardly directed force created by the flange 732 causes the biasing member 700 to deflect in a more centralized region (e.g., proximate to the opening 710), rather than at the end 704u and/or the end 704l, and increases the threshold force that must be applied to the slider 600 to move the slider 600 from the first position (FIG. 9) into the second position (FIGS. 11, 12) and cause deflection of the biasing member 700 in the manner discussed above. The flange 732 thus further inhibits accidental or unwanted movement of the slider 600 into the second position and inadvertent (e.g., accidental or unwanted) unlocking and opening of the door assembly 400. Additionally, the outwardly directed force created by the flange 732 is communicated to the slider 600 via engagement (contact) between the support surface 726 and the deflector 606 and engagement (contact) between the deflector 702 and the inner surface 618 of the slider 600 to bias the slider 600 outwardly and thereby maintain the lateral (horizontal) position of the slider 600.

The door lock 800 is configured for (engagement) contact with the biasing member 700 to maintain the axial (vertical) position of the biasing member 700, and, thus, the door body 500, until application of the threshold force mentioned above. Upon application of the threshold force, the biasing member 700 is disengaged from (moved out of contact with) the door lock 800 to allow for movement of the biasing member 700 and the door body 500, and, thus, unlocking of the door assembly 400. The door lock 800 may include any suitable material or combination of materials, and may be formed through any suitable method of manufacture (e.g., stamping, injection molding, machining, etc.). For example, in the particular embodiment shown throughout the figures, the door lock 800 is integrally (e.g., monolithically) formed from a metallic material (e.g., spring steel, aluminum, etc.).

The door lock 800 includes an inner body portion 802 with one or more openings 804 that are configured to receive corresponding structure(s) on the sealing member 900 to fixedly connect the door lock 800 to the sealing member 900. More specifically, in the embodiment illustrated throughout the figures, the door lock 800 includes a pair of openings 804*i*, 804*ii* that are configured to receive corresponding projections 902*i*, 902*ii* (e.g., posts 904*i*, 904*ii*) that extend outwardly from the sealing member 900 (i.e., towards the door body 500).

In certain embodiments, such as that shown throughout the figures, for example, the inner body portion 802 may further include a cutout (e.g., a relief, opening, etc.) 806 that is configured to receive a corresponding anchor 906 that extends outwardly from the sealing member 900 (i.e., towards the door body 500). Receipt of the anchor 906 within the cutout 806 further secures the door lock 800 in relation to the sealing member 900 and inhibits (if not entirely prevents) relative rotation between the door lock 800 and the sealing member 900.

The door lock 800 further includes an outer support structure 808 that is spaced outwardly from the inner body portion 802 (i.e., closer to the door body 500). More specifically, in the illustrated embodiment, the outer support structure 808 includes a pair of rails 810*i*, 810*ii* that extend in generally parallel relation to the inner body portion 802. The rails 810*i*, 810*ii* are spaced from the inner body portion 802 by (horizontal) struts 812*i*-812*iv* that extend from corner sections of the inner body portion 802 such that the rails 810*i*, 810*ii* and the inner body portion 802 collectively define a pair of (horizontal) receiving spaces 814 that are configured to receive the retention structure(s) 712 on the biasing member 700. More specifically, the rails 810*i*, 810*ii* and the inner body portion 802 define channels 816*i*, 816*ii* that extend (vertically) in generally parallel relation to the longitudinal axis Y (FIG. 6) of the door assembly 400. The channels 816*i*, 816*ii* are configured to receive the wings 724*i*, 724*ii* such that the wings 724*i*, 724*ii* are positioned adjacent to (e.g., in contact with) inner surfaces 818*i*, 818*ii* defined by the rails 810*i*, 810*ii*, respectively, which inhibits (if not entirely eliminates) relative (lateral) movement between the door lock 800 and the biasing member 700 and, thus, relative (lateral) movement between the door lock 800 and the door body 500. More specifically, the engagement (contact) between the biasing member 700 and the door lock 800 established by receipt of the wings 724*i*, 724*ii* within the channels 816*i*, 816*ii*, respectively, inhibits (if not entirely eliminates) movement of the biasing member 700 and the door body 500 towards and away from the sealing member 900 along an axis X (FIG. 6) that is generally orthogonal in relation to the longitudinal axis Y of the door assembly 400.

Each rail 810 includes a stop 820 (e.g., a nub, projection, detent, or other such surface irregularity) that is configured for engagement (contact) with the retention structure(s) 712 on the biasing member 700. More specifically, the rail 810*i* includes a stop 820*i* that is configured for engagement (contact) with the wing 724*i*, and the rail 810*ii* includes a stop 820*ii* that is configured for engagement (contact) with the wing 724*ii*. Although illustrated as extending inwardly from the rails 810*i*, 810*ii* (i.e., towards the sealing member 900), it should be appreciated that the stops 820*i*, 820*ii* may extend outwardly in alternate embodiments without departing from the scope of the present disclosure. For example, in alternate embodiments, it is envisioned that the stops 820 may instead be configured as recesses, cutouts, etc.

As mentioned above, it is envisioned that the number of wings 724 included on the biasing member 700 may be varied in alternate embodiments of the disclosure (e.g., such that the biasing member includes only a single wing 724). As such, embodiments of the door lock 800 are also envisioned in which the door lock 800 includes a single rail 810 with a single stop 820.

In addition to facilitating contact between the door lock 800 and the biasing member 700 in the manner discussed above, it is envisioned that inclusion of the channels 816*i*, 816*ii* may facilitate manufacture of the door lock 800. For example, the channels 816*i*, 816*ii* may allow for undercutting, thereby reducing the complexity associated with fabrication (e.g., molding of the stops 820*i*, 820*ii* to the rails 810*i*, 810*ii*, respectively).

As can be appreciated through reference to FIGS. 7-10, when the slider 600 is in the first position, the wings 724*i*, 724*ii* are in general registration (vertical alignment) with the stops 820*i*, 820*ii* respectively included on the rails 810*i*, 810*ii*, which inhibits (if not entirely prevents) movement of the biasing member 700, and, thus, the door body 500, in relation to the body 102 of the image capture device 100. Upon application of the threshold force to the slider 600, however, the biasing member 700 is deflected such that the wings 724*i*, 724*ii* are moved out of respective (vertical) alignment with the stops 820*i*, 820*ii*. More specifically, upon deflection of the biasing member 700, the wings 724*i*, 724*ii* are moved inwardly (i.e., away from the door body 500), which allows the wings 724*i*, 724*ii* to move past the stops 820*i*, 820*ii*, thus allowing for movement of the biasing member 700 and the door body 500 in relation to the body 102 of the image capture device 100 to unlock the door assembly 400.

To increase stability and/or rigidity of the door lock 800, in certain embodiments, such as that shown throughout the figures, the door lock 800 may further include reinforcements 822. More specifically, in the illustrated embodiment, the door lock 800 includes a pair of upper walls 824*iu*, 824*iiu* and a pair of lower walls 824*il*, 824*iil*, each of which extends outwardly from the inner body portion 802 (i.e., towards the door body 500).

The sealing member 900 is configured in correspondence with the peripheral cavity 122 (FIGS. 4D, 5) defined by the body 102 of the image capture device 100 such that the sealing member 900 is insertable into and removable from the peripheral cavity 122 during opening and closure of the door assembly 400. More specifically, in the illustrated embodiment, the sealing member 900 includes a pair of generally linear sidewalls 908*i*, 908*ii*; a pair of generally linear end walls 910*i*, 910*ii* that extend between the sidewalls 908*i*, 908*ii*; and radiused corner portions 912*i*-912*iv*. It should be appreciated, however, that the specific configuration of the sealing member 900 may be altered in various embodiments without departing from the scope of the present disclosure (e.g., depending upon the particular configuration of the image capture device 100, the peripheral cavity 122, etc.).

The sealing member 900 includes a resilient, compressible material to facilitate sealed engagement (contact) with the body 102 of the image capture device 100 upon closure of the door assembly 400, and, thus, the formation of a (waterproof) seal in the peripheral cavity 122. More specifically, as the door assembly 400 is closed, pressure is applied to the sealing member 900 as the sealing member 900 is compressed against the body 102 of the image capture device 100, which causes lateral (horizontal) and/or axial (vertical) expansion of the sealing member 900 to thereby seal against the body 102. It is envisioned that the sealing member 900 may include (e.g., may be formed from) any material or combination of materials suitable for the intended purpose of sealing the body 102 (e.g., the peripheral cavity 122) in the manner described herein. For example, in the particular embodiment of the disclosure illustrated throughout the figures, the sealing member 900 includes an outer layer 914o (FIG. 12) that is formed from a (first) compressible material (e.g., silicone rubber), and an inner layer (core) 914i that is formed from a (second) material (e.g., a metallic material, polycarbonate, etc.) to increase rigidity and stability of the sealing member 900 and the door assembly 400. It should be appreciated, however, that, in alternate embodiments of the disclosure, it is envisioned that the material(s) used in construction of the sealing member 900 may be varied, and that the sealing member 900 may be formed from a single material only.

The sealing member 900 is spaced inwardly from the biasing member 700 (i.e., further from the door body 500 and closer to the body 102 of the image capture device 100), and is integrated into the door assembly 400. More specifically, the sealing member 900 is fixedly connected to the door lock 800 such that the door lock 800, the biasing member 700, and the slider 600 are positioned between the door body 500 and the sealing member 900.

The sealing member 900 includes a cavity 916, which is defined by respective upper and lower end walls 918u, 918l, that is configured to receive the door lock 800. To facilitate securement of the door lock 800 within the cavity 916, as mentioned above, in the illustrated embodiment, the sealing member 900 includes projections 902i, 902ii (e.g., posts 904i, 904ii) that extend outwardly from the sealing member 900 (i.e., towards the door body 500) from within the cavity 916 for insertion into the openings 804i, 804ii formed in the inner body portion 802 of the door lock 800, respectively. To further secure the door lock 800 and the sealing member 900, in certain embodiments, it is envisioned that the door lock 800 and the sealing member 900 may be heat-staked together. The sealing member 900 is, thus, indirectly connected to the door body 500, the slider 600, and the biasing member 700 via the door lock 800.

With reference to FIGS. 7 and 8 in particular, the sealing member 900 defines a chamber 920 that is configured to receive the body portion 706 of the biasing member 700. To further accommodate the biasing member 700, the sealing member 900 defines a channel 922, which is positioned within the chamber 920, that is configured to receive the finger 708 extending from the body portion 706 of the biasing member 700 to limit (vertical) travel of the biasing member 700 and the door body 500, as mentioned above. More specifically, upon movement of the biasing member 700 into the deflected configuration (FIGS. 11, 12), as the biasing member 700 slides with the door body 500, the finger 708 traverses the channel 922. The finger 708 is configured for engagement (contact) with an end wall 924 defining the channel 922 so as to inhibit (if not entirely prevent) continued distal (vertically downward) movement of the biasing member 700 (in the direction indicated by arrow 1 in FIGS. 9, 11, and 12). The (vertical) range of motion for the door assembly 400 is thus defined by engagement (contact) between the upper end 502u of the door body 500 and a distal end surface 140 (FIG. 4C) of the body 102 of the image capture device 100 (at an upper end of the range of motion), and engagement (contact) between the finger 708 on the body portion 706 of the biasing member 700 and the end wall 924 defining the channel 922 (at a lower end of the range of motion). For example, in the embodiment of the disclosure shown throughout the figures, it is envisioned that the (vertical) range of motion for the door assembly 400 may lie substantially within the range of approximately 3 mm to approximately 7 mm. However, by varying the axial (vertical) dimension of the channel 922 (e.g., the length of the channel 922), and/or the axial (vertical) dimension of the finger 708 (e.g., the length of the channel 708), the range of motion of the door assembly 400 between the locked and unlocked positions can be tuned as necessary or desired. As such, ranges of motion outside the range of approximately 3 mm to approximately 7 mm are also contemplated herein.

The sealing member 900 further defines a lateral relief 926 that is positioned between the rails 508i, 508ii on the door body 500. The lateral relief 926 is configured to receive the side portion 610i of the slider 600 and provides a bearing surface 928 for the slider 600 such that the slider 600 travels within the lateral relief 926 during movement between the first position (FIG. 9) and the second position (FIGS. 11, 12) during unlocking and locking of the door assembly 400. The lateral relief 926 is defined by an end wall 930 that is configured for engagement (contact) with the slider 600 to limit proximal (vertically upward) travel of the slider 600 so as to ensure and maintain clearance (spacing) between the slider 600 and the upper edge 516u of the window 506 in the door body 500 when the slider 600 is in the first position. It is envisioned that reducing (if not entirely eliminating) contact between the slider 600 and the upper edge 516u of the window 506 may inhibit (if not entirely prevent) inadvertent (e.g., accidental or unwanted) movement of the slider 600 (e.g., in the event that the image capture device is dropped) and, thus, inadvertent (e.g., accidental or unwanted) unlocking and opening of the door assembly 400.

Figure 13:
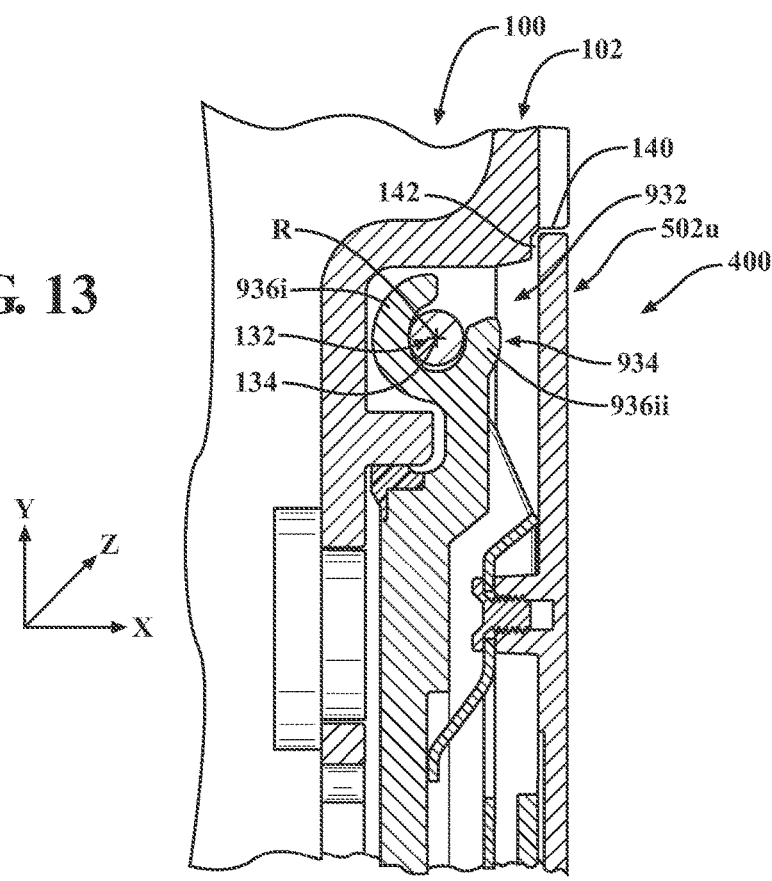
FIG. 13 is a partial (vertical) cross-sectional view of the door assembly shown connected to the image capture device in the closed, locked position.
Figure 14:
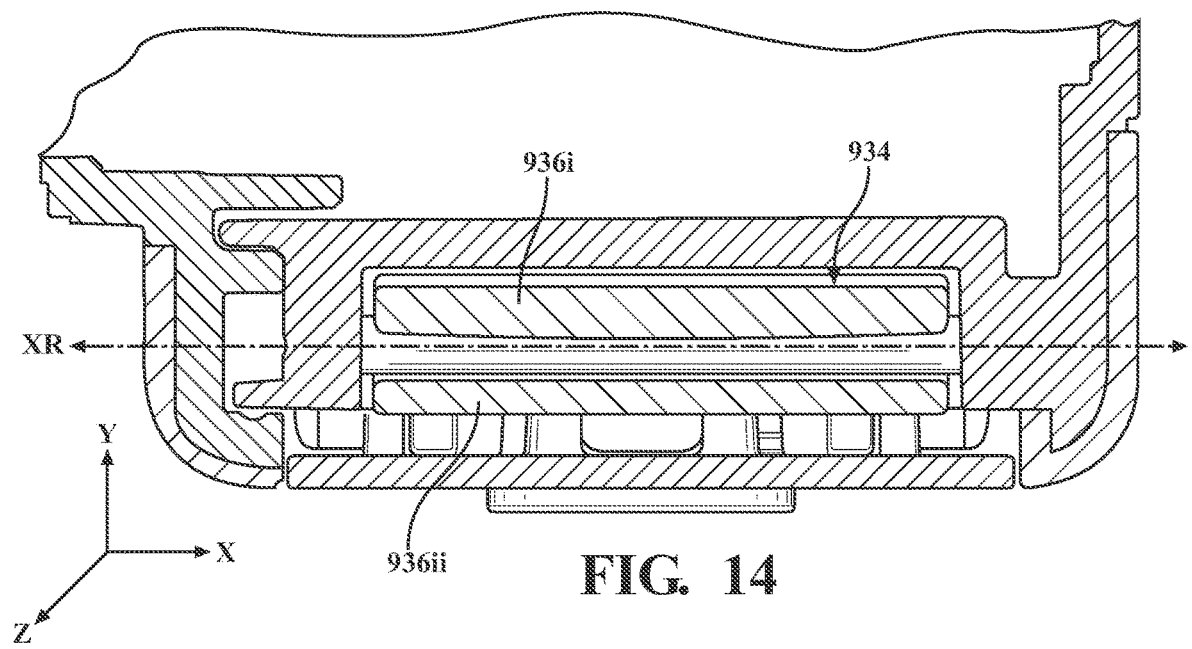
FIG. 14 is a partial (horizontal) cross-sectional view of the door assembly shown connected to the image capture device in the closed, locked position.

Reference will now be made to FIGS. 13 and 14 as well, which provide respective axial (vertical) and transverse (horizontal) cross-sectional views of the door assembly 400 shown connected to the body 102 of the image capture device 100. To facilitate connection of the door assembly 400 to the pivot member 132, the sealing member 900 includes an engagement structure 932 (e.g., a clip 934). Although shown as being integrally formed with the sealing member 900 in the illustrated embodiment, it should be appreciated that the engagement structure 932 may be formed as a separate, discrete component that is secured to the sealing member 900 (e.g., via adhesive, welding, etc.) without departing from the scope of the present disclosure. Additionally, while shown as including a single clip 934, it should be appreciated that the number of clips 934 may be varied in alternate embodiments of the door assembly 400.

The clip 934 is configured for engagement (contact) with the pivot member 132 to axially (vertically) fix the sealing member 900 in relation to the housing 102 of the image capture device 100 while allowing the door assembly 400 to rotate in relation to the body 102 during opening and closure. More specifically, the door assembly 400 is rotatable about an axis of rotation XR (FIGS. 5, 13, 14) that extends through the pivot member 132, and through the clip 934.

The clip 934 is generally C-shaped in configuration, and includes arms 936i, 936ii that define a channel 938 therebetween that is configured to receive the pivot member 132 such that the clip 934 is rotatable in relation to the pivot member 132 during opening and closure of the door assembly 400. For example, in certain embodiments, such as that shown throughout the figures, the clip 934 may be configured to create an interference fit (e.g., a snap-fit) with the pivot member 132 in a manner allowing for rotation of the clip 934 relative to the pivot member 132.

With reference to FIGS. 13 and 14 in particular, the clip 934 is configured to create clearance (gapping) in one or more of the X-, Y-, and Z-directions to allow for movement of the sealing member 900 relative to the pivot member 132 and the body 102 of the image capture device 100 in one or more of the X-, Y-, and Z-directions. Such movement allows the sealing member 900 and, thus, the door assembly 400, to automatically center itself with respect to the peripheral cavity 122 (FIGS. 4D, 5) defined by the body 102 of the image capture device 100 during closure of the door assembly 400 to facilitate the formation of a waterproof seal between the door assembly 400 and the body 102 of the image capture device 100.

To facilitate connection of the clip 934 to the pivot member 132, it is envisioned that the clip 934 may include a resilient (e.g., flexible) material, such as stainless steel, which allows the arm 934ii and/or the arm 934i to deflect during connection to the pivot member 132 and return to its normal position upon receipt of the pivot member 132 within the channel 938. As the pivot member 132 seats within the channel 938, due to the resilient (flexible) material used in construction of the clip 934, and the resultant deflection created during connection of the clip 934 to the pivot member 132, in certain embodiments, as the clip 934 returns to its normal position, it is envisioned that the clip 934 may provide an audible indication that the pivot member 132 has been properly connected to the clip 934.

In certain embodiments of the disclosure, such as that shown throughout the figures, the door assembly 400 may further include the aforementioned spacer 1000, which is seen in FIGS. 4A, 4B, and 5, for example. The spacer 1000 is configured for positioning between the sealing member 900 and the body 102 of the image capture device 100, and, in the illustrated embodiment, is configured as a foam block 1002. The spacer 1000 may include (e.g., may be formed from) any material suitable for the intended purpose(s) of enhancing the seal formed between the sealing member 900 and the body 102 of the image capture device 100 upon closure of the door assembly 400; reducing (if not entirely eliminating) undesirable relative movement between the components of the door assembly 400; increasing shock absorption; and/or enhancing electrical connectivity between the components of the image capture device (e.g., connection of the battery 322 (FIG. 4D)).

To facilitate proper orientation of the spacer 1000 relative to the sealing member 900, in certain embodiments, the sealing member 900 may include one or more raised ribs 940 (or other such projections or surface irregularities) on an inner face 942 thereof, the ribs 940 (or other such projections or surface irregularities) collectively defining a receiving space 944 for the spacer 1000 to guide the spacer 1000 into proper positioning. Additionally, or alternatively, it is envisioned that the spacer 1000 may be secured to the sealing member 900, such as, for example, through the use of one or more mechanical fasteners (e.g., screws), an adhesive, etc.

With reference to FIGS. 7 and 8, assembly of the door assembly 400 will be discussed. Initially, the door lock 800 (FIGS. 7, 8) is secured to the sealing member 900 by positioning the projections 902i, 902ii within the respective openings 804i, 804ii formed in the door lock 800. As mentioned above, it is envisioned that the door lock 800 and the sealing member 900 may be heat-staked to further secure together the door lock 800 and the sealing member 900.

Either prior or subsequent to connection of the door lock 800 and the sealing member 900, the biasing member 700 is positioned within the door lock 800 such that the retention structure(s) 712 (e.g., the wings 724i, 724ii) are located within the channels 816i, 816ii adjacent to (e.g., in contact with) the stops 820i, 820ii on the rails 810i, 810ii, respectively. The biasing member 700 can then be connected to the door body 500 with the slider 600 being positioned therebetween. More specifically, the side portions 610i, 610ii of the slider 600 are positioned within the channels 522i, 522ii defined by the rails 508i, 508ii on the inner surface 518 of the door body 500 such that the tactile member 604 extends through the window 506, and the biasing member 700 is connected to the door body 500 such that the ramp 608 extends through the opening 710 in the body portion 706 of the biasing member 700. To connect the biasing member 700 to the door body 500, the fastener 528 is inserted into the boss 524 through the opening 716i in the upper end 706u of the biasing member 700, and the detents 526i, 526ii extending from the boss structure 510 are positioned within the openings 716ii, 716iii. Upon connection of the biasing member 700 to the door body 500, the deflector 606 on the slider 600 is positioned adjacent to (e.g., in engagement (contact) with) the deflector 702 on the biasing member 700 so as to resist movement of the slider 600 from the first position to the second position until application of the threshold force.

Either prior or subsequent to assembly of the sealing member and the door lock 800, and connection of the biasing member 700 to the door body 500, the spacer 1000 can be connected to the sealing member 900 (e.g., by securing the spacer 1000 within the receiving space 944 defined on the inner face 942 of the sealing member 900 by the ribs 940).

Should disassembly be required (e.g., during repair, maintenance, debris removal, etc.), a tool (not shown), such as a shim, a screwdriver, or the like, may be positioned between the biasing member 700 and the sealing member 900 to separate the biasing member 700, and, thus, the slider 600 and the door body 500, from the sealing member 900 and the door lock 800. More specifically, as seen in FIG. 12, for example, the flange 714 included at the upper end 706u of the biasing member 700 defines a receiving space 734 with an angled upper end surface 946 defining the chamber 920 that is configured to receive the tool. Upon insertion of the tool into the receiving space 734, force can be applied to the tool to thereby separate the biasing member 700 from the sealing member 900.

With reference now to FIGS. 4A-14, use and operation of the door assembly 400 will be discussed. When necessary or desired, the door assembly 400 can be moved from the closed position (FIGS. 4A-4C) to the open position (FIGS. 4D, 4E) (e.g., to remove and/or replace the power source 124 (e.g., the battery 322) with a larger power source 124, and/or to provide access to the accessory port 126; the I/O interface 114; the USB-C connector 128; etc.). To allow for movement of the door assembly 400 from the closed position to the open position, the slider 600 is moved from the first position (FIG. 9) into the second position (FIGS. 11, 12) to move the door body 500 from the locked position (FIGS. 4A, 4B) to the unlocked position (FIGS. 4C, 5), and thereby unlock the door assembly 400. Due to the arrangement and connection of the biasing member 700, the slider 600, and the door body 500 established by connection of the fastener 528 to the boss 524 and positioning of the detents 526i, 526ii within the openings 716ii, 716iii, the slider 600 is movable relative to the door body 500 and the biasing member 700, and the assembly of the biasing member 700, the slider 600, and the door body 500 is movable relative to the door lock 800 and the sealing member 900 during locking and unlocking. The door lock 800 and the sealing member 900 thus collectively constitute a stationary subassembly, and the door body 500, the slider 600, and the biasing member 700 collectively constitute a movable subassembly.

Movement of the slider 600 from the first position to the second position, and, thus, unlocking of the door assembly 400, is resisted by contact between the deflectors 606, 702 (FIG. 9) until the threshold force is applied to the slider 600, which inhibits (if not entirely prevents) accidental or unwanted movement of the slider 600 and/or the door assembly 400, and, thus, unlocking and/or opening of the door assembly 400 (e.g., in the event that the image capture device 100 is dropped). Upon application of the threshold force, the deflector 606 traverses the deflector 702, and the angled surface 622 of the ramp 608 contacts and traverses the end wall 720 defining the opening 710 such that the ramp 608 is withdrawn from the opening 710. Movement of the deflector 606 across the deflector 702 causes initial inward deflection of the biasing member 700 (i.e., movement away from the door body 500 and towards the door lock 800), which is supplemented by travel of the angled surface 622 of the ramp 608 across the end wall 720 to move the biasing member 700 into the deflected configuration (FIGS. 11, 12). As the biasing member 700 moves into the deflected configuration, the wings 724i, 724ii on the biasing member are moved out of axial (vertical) alignment with the stops 820i, 820ii on the rails 810i, 810ii of the door lock 800, which allows for distal (i.e., vertically downward) movement of the biasing member 700 (in the direction indicated by the arrow 5 (FIG. 5)).

After movement of the biasing member 700 into the deflected configuration, continued distal movement of the slider 600 results in positioning of the inner surface 624 (FIGS. 11, 12) of the ramp 608 upon the support surface 726 of the body portion 706 of the biasing member 700, which allows for movement of the slider 600 into the second position. In the second position, a distal (lower) end face 626 of the tactile member 604 is positioned in engagement (contact) with the lower edge 5161 of the window 506 in the door body 500 such that distal (downward) force applied to the slider 600 is communicated to the door body 500 via the tactile member 604 to thereby move the door body 500 into the unlocked position. Alternatively, it is envisioned that force may be applied directly to the door body 500 (e.g., via manual engagement), rather than indirectly (via the slider 600), after movement of the slider 600 into the second position.

Due to the fixed connection between the biasing member 700 and the door body 500 established by receipt of the fastener 528 within the boss 524 and receipt of the detents 526i, 526ii within the respective openings 716ii, 716iii in the upper end 704u of the biasing member 700, the force applied to the door body 500 is communicated to the biasing member 700 such that the door body 500 and the biasing member 700 are moved in tandem. Distal movement of the door body 500 results in removal of the locking member 504 (FIG. 5) from the receptacle 136 in the body 102 of the image capture device 100, thus unlocking the door body 500 (and the door assembly 400), as well as withdrawal of the upper end 502u of the door body 500 from a recess 142 (FIG. 13) defined by the distal end surface 140 (FIG. 5) of the body 102 and an outer surface 144. Withdrawal of the upper end 502u of the door body 500 from the recess 142 creates sufficient axial (vertical) clearance between the door body 500 and the body 102 of the image capture device 100 to allow for rotation of the door assembly 400 in relation to (i.e., away from) the body 102 of the image capture device 100 into the open position about the axis of rotation XR.

If necessary or desired, the door assembly 400 can then be separated from the body 102 of the image capture device 100. For example, a pulling force can be applied to the door assembly 400 to deflect the arms 936i, 936ii of the clip 934 such that the clip 934 can be separated from the pivot member 132.

To reconnect the door assembly 400 to the body 102 of the image capture device 100, the pivot member 132 is re-inserted into channel 938 of the clip 934, during which, the resilient material used in construction of the clip 934 allows for deflection of the arms 936i, 936ii. More specifically, the pivot member 132 deflects the arm 936ii of the clip 934 outwardly (away from the arm 936i) such that the pivot member 132 is received and seated within the channel 938.

After reconnection of the door assembly 400, the door assembly 400 can be rotated in relation to (i.e., towards) the body 102 of the image capture device 100 into the closed position. During closure of the door assembly 400, the sealing member 900 and the spacer 1000 are compressed (e.g., via contact with the portions of the body 102 defining the peripheral cavity 122) so as to seal the door assembly 400 and the body 102. Once closed, the door assembly 400 can be moved into the locked position (FIGS. 4A, 4B), during which, the door body 500, the biasing member 700, and the slider 600 are moved proximally (vertically upward) (in the direction indicated by the arrow 6 (FIG. 5)). Proximal movement of the door body 500, the biasing member 700, and the slider 600 causes the inner surface 624 of the ramp 608 to traverse the support surface 726 of the body portion 706 of the biasing member 700, and causes the deflector 606 to pass the deflector 702 such that the ramp 608 re-enters the opening 710. As the ramp 608 re-enters the opening 710, and the normal configuration of the biasing member 700 is restored, the deflectors 606, 702 are brought into contact. Due to the corresponding arcuate configurations of the deflectors 606, 702, and the resilient construction of the biasing member 700, it is envisioned that contact between the deflectors 606, 702 may facilitate (e.g., encourage) proximal (upward) movement of the slider 600 (i.e., towards the pivot member 132) and return of the slider 600 to the first position.

As the door body 500 moves proximally (i.e., towards the pivot member 132), the locking member 504 (FIG. 5) is re-inserted into the receptacle 136 in the housing 102 of the image capture device 100 to thereby inhibit (if not entirely prevent) inadvertent (e.g., accidental or unwanted) opening of the door assembly 400 (e.g., in the event that the image capture device 100 is dropped). Additionally, as seen in FIG. 13, in the locked position, the upper end 502u of the door body 500 is positioned adjacent to (e.g., in engagement (contact) with) the surfaces 140, 144 defining the recess 142 to reduce, if not entirely eliminate, gapping between the door assembly 400 and the body 102 of the image capture device 100 when the door assembly 400 is in the closed, locked position. As such, when the door assembly 400 is in the closed, locked position, the pivot member 132 is completely concealed by the door assembly 400.

It is envisioned that the sliding motion of the slider 600 and the door body 500 during the locking and unlocking of the door assembly 400 may improve the user feel and the overall user experience, in that the unlocking of the door assembly 400, the opening of the door assembly 400, and/or the removal of the door assembly 400 from the body 102 of the image capture device 100 may be accomplished via a single motion (i.e., distal (downward) movement of the slider 600 and the door body 500). To further improve the user experience, in certain embodiments, it is envisioned that an additional biasing member (e.g., a spring) (not shown) may be positioned between the body 102 of the image capture device 100 and the door assembly 400 to urge the door assembly 400 into the open position once the door assembly 400 is unlocked. In such embodiments, it is thus envisioned that the door assembly 400 may be unlocked and opened by a single motion (i.e., by moving the door assembly 400 into the unlocked position).

Persons skilled in the art will understand that the various embodiments of the disclosure described herein, and shown in the accompanying figures, constitute non-limiting examples, and that additional components and features may be added to any of the embodiments discussed hereinabove without departing from the scope of the present disclosure. Additionally, persons skilled in the art will understand that the elements and features shown or described in connection with one embodiment may be combined with those of another embodiment without departing from the scope of the present disclosure to achieve any desired result, and will appreciate further features and advantages of the presently disclosed subject matter based on the description provided. Variations, combinations, and/or modifications to any of the embodiments and/or features of the embodiments described herein that are within the abilities of a person having ordinary skill in the art are also within the scope of the disclosure, as are alternative embodiments that may result from combining, integrating, and/or omitting features from any of the disclosed embodiments.

Use of the term "optionally" with respect to any element of a claim means that the element may be included or omitted, with both alternatives being within the scope of the claim. Additionally, use of broader terms such as "comprises," "includes," and "having" should be understood to provide support for narrower terms such as "consisting of," "consisting essentially of," and "comprised substantially of." Accordingly, the scope of protection is not limited by the description set out above, but is defined by the claims that follow, and includes all equivalents of the subject matter of the claims.

In the preceding description, reference may be made to the spatial relationship between the various structures illustrated in the accompanying drawings, and to the spatial orientation of the structures. However, as will be recognized by those skilled in the art after a complete reading of this disclosure, the structures described herein may be positioned and oriented in any manner suitable for their intended purpose. Thus, the use of terms such as "above," "below," "upper," "lower," "inner," "outer," "left," "right," "upward," "downward," "inward," "outward," "horizontal," "vertical," etc., should be understood to describe a relative relationship between the structures and/or a spatial orientation of the structures. Those skilled in the art will also recognize that the use of such terms may be provided in the context of the illustrations provided by the corresponding figure(s).

Additionally, terms such as "approximately," "generally," "substantially," and the like should be understood to allow for variations in any numerical range or concept with which they are associated. For example, it is intended that the use of terms such as "approximately" and "generally" should be understood to encompass variations on the order of 25%, or to allow for manufacturing tolerances and/or deviations in design.

Although terms such as "first," "second," etc., may be used herein to describe various operations, elements, components, regions, and/or sections, these operations, elements, components, regions, and/or sections should not be limited by the use of these terms in that these terms are used to distinguish one operation, element, component, region, or section from another. Thus, unless expressly stated otherwise, a first operation, element, component, region, or section could be termed a second operation, element, component, region, or section without departing from the scope of the present disclosure.

Each and every claim is incorporated as further disclosure into the specification, and represents embodiments of the present disclosure. Also, the phrases "at least one of A, B, and C" and "A and/or B and/or C" should each be interpreted to include only A, only B, only C, or any combination of A, B, and C.

What is claimed is:

1. An image capture device, comprising:
    a body defining a peripheral cavity; and
    a door assembly movable between an open position and a closed position to close and seal the peripheral cavity, the door assembly including:
        a door body defining a window;
        a slider extending into the window and supported by the door body for axial movement between a first position, in which the door body is axially fixed in relation to the body of the image capture device to inhibit movement of the door assembly from the closed position to the open position, and a second position, in which the door body is axially movable in relation to the body of the image capture device to allow for movement of the door assembly from the closed position to the open position;
        a biasing member configured for contact with the slider such that axial movement of the slider causes deflection of the biasing member from a normal configuration to a deflected configuration, the biasing member being axially fixed to the door body such that axial movement of the door body causes corresponding axial movement of the biasing member;
        a door lock including a stop configured for contact with the biasing member in the normal configuration to inhibit axial movement of the biasing member and the door body, wherein deflection of the biasing member during movement from the normal configuration to the deflected configuration moves the biasing member out of contact with the stop to allow for axial movement of the biasing member and the door body; and
        a sealing member fixedly connected to the door lock such that the door lock, the biasing member, and the slider are positioned between the door body and the sealing member, the sealing member including a resilient material and being positioned such that the sealing member is compressed within the peripheral cavity during movement of the door assembly from the open position to the closed position to form a seal between the door assembly and the body of the image capture device when the door assembly is in the closed position.

2. The image capture device of claim 1, wherein the image capture device further includes one or more of a power source, an accessory port, an I/O interface, and a USB-C connector, the power source, the accessory port, the I/O interface, and/or the USB-C connector being positioned for access via the peripheral cavity when the door assembly is in the open position.

3. The image capture device of claim 1, wherein the door body is axially movable between a locked position and an unlocked position, the door assembly being rotationally fixed in relation to the body of the image capture device when the door body is in the locked position and rotatable in relation to the body of the image capture device when the door body is in the unlocked position to allow for movement of the door assembly from the closed position to the open position.

4. The image capture device of claim 3, wherein the door body includes a locking member configured for engagement with a receptacle defined by the body of the image capture device when the door body is in the locked position, the locking member being separated from the receptacle when the door body is in the unlocked position.

5. The image capture device of claim 3, wherein the biasing member includes a retention structure configured for contact with the stop on the door lock, the retention structure and the stop being axially aligned when the biasing member is in the normal configuration to inhibit axial movement of the biasing member and the door body, wherein movement of the biasing member into the deflected configuration causes axial misalignment between the retention structure and the stop to allow for axial movement of the biasing member and the door body.

6. The image capture device of claim 5, wherein the retention structure includes a pair of wings extending laterally outward from a body portion of the biasing member, the wings being configured for positioning within corresponding channels defined by the door lock to inhibit movement of the biasing member and the door body away from the sealing member along an axis generally orthogonal in relation to a longitudinal axis of the door assembly.

7. The image capture device of claim 5, wherein the slider includes a deflector configured for contact with the biasing member to facilitate deflection of the biasing member towards the door lock as the slider moves from the first position to the second position.

8. The image capture device of claim 7, wherein the biasing member defines an opening configured to receive the slider, the slider including an angled surface configured for contact with an end wall defining the opening in the biasing member to facilitate deflection of the biasing member as the slider moves from the first position to the second position.

9. The image capture device of claim 8, wherein the sealing member defines a channel configured to receive a finger extending from the biasing member, the channel defining an end wall configured for contact with the finger to inhibit continued axial movement of the biasing member and the door body.

10. The image capture device of claim 9, wherein the sealing member is indirectly connected to the door body via the door lock and the biasing member.

11. The image capture device of claim 10, wherein the sealing member includes an engagement structure configured to rotatably connect and axially fix the sealing member to the body of the image capture device such that the door assembly is rotatable in relation to the body of the image capture device during movement between the open position and the closed position.

12. A door assembly for an image capture device, the door assembly comprising:

a sealing member releasably connectable to the image capture device, the sealing member configured to form a seal with the image capture device upon closure of the door assembly;

a door lock fixed to the sealing member;

a biasing member received by the door lock;

a door body axially movable in relation to the image capture device along a first axis of movement between a locked position, in which the door assembly is rotationally fixed in relation to the image capture device, and an unlocked position, in which the door assembly is rotatable in relation to the image capture device to allow for opening of the door assembly, the door body being fixedly connected to the biasing member such that axial movement of the door body causes corresponding axial movement of the biasing member; and a slider supported by the door body to facilitate axial movement of the slider along a second axis of movement extending in generally parallel relation to the first axis of movement, the slider configured for contact with the biasing member such that movement of the slider between first and second positions causes deflection of the biasing member between a normal configuration and a deflected configuration, wherein the biasing member and the door body are axially fixed in relation to the image capture device when the biasing member is in the normal configuration and are axially movable in relation to the image capture device when the biasing member is in the deflected configuration such that movement of the slider into the second position facilitates opening of the door assembly.

13. The door assembly of claim 12, wherein the door lock includes a pair of stops, and the biasing member includes a pair of wings axially aligned with the stops when the biasing member is in the normal configuration such that engagement between the stops and the wings inhibits axial movement of the biasing member and the door body, wherein movement of the biasing member into the deflected configuration moves the wings out of axial alignment with the stops to allow for axial movement of the biasing member and the door body.

14. The door assembly of claim 13, wherein the wings are configured for positioning within corresponding channels defined by the door lock to inhibit movement of the biasing member and the door body away from the sealing member along an axis generally orthogonal in relation to a longitudinal axis of the door assembly.

15. The door assembly of claim 13, wherein the slider includes a deflector configured for contact with the biasing member to facilitate deflection of the biasing member during axial movement of the slider from the first position to the second position and movement of the wings out of axial alignment with the stops.

16. The door assembly of claim 15, wherein the biasing member defines an opening configured to receive the slider, the slider including an angled surface configured for contact with an end wall defining the opening in the biasing member to facilitate deflection of the biasing member as the slider moves from the first position to the second position.

17. The door assembly of claim 16, wherein the sealing member defines a channel configured to receive a finger extending from the biasing member, the channel defining an end wall configured for contact with the finger to inhibit continued axial movement of the biasing member and the door body.

18. A method of assembling an image capture device including a door assembly, the method comprising:
- removably connecting the door assembly to the image capture device by inserting a pivot member on the image capture device into a clip on a sealing member of the door assembly to allow for rotation of the door assembly in relation to a body of the image capture device during opening and closure;
- fixedly securing a door lock to the sealing member;
- positioning a biasing member within the door lock;
- connecting a slider to a door body such that the slider is axially movable in relation to the door body, the slider configured for contact with the biasing member such that axial movement of the slider causes deflection of the biasing member; and
- fixedly connecting the biasing member to the door body such that axial movement of the door body during locking and unlocking of the door assembly causes corresponding axial movement of the biasing member.

19. The method of claim 18, wherein connecting the slider and the biasing member to the door body includes positioning the slider and the biasing member such that, during locking and unlocking of the door assembly, the slider is movable along a first axis of movement and the biasing member and the door body are movable along a second axis of movement extending in generally parallel relation to the first axis of movement.

20. The method of claim 19, wherein connecting the biasing member to the door body includes connecting the biasing member to the door body such the biasing member is deflectable along an axis of movement extending in generally orthogonal relation to each of the first axis of movement and the second axis of movement.

* * * * *